(12) United States Patent
Ohsumi

(10) Patent No.: US 8,319,115 B2
(45) Date of Patent: Nov. 27, 2012

(54) WIRING BOARD AND MANUFACTURING METHOD THEREOF

(75) Inventor: Kohichi Ohsumi, Yasu (JP)

(73) Assignee: Kyocera SLC Technologies Corporation, Shiga (JP)

( * ) Notice: Subject to any disclaimer, the term of this patent is extended or adjusted under 35 U.S.C. 154(b) by 401 days.

(21) Appl. No.: 12/562,956

(22) Filed: Sep. 18, 2009

(65) Prior Publication Data

US 2010/0071950 A1 Mar. 25, 2010

(30) Foreign Application Priority Data

Sep. 22, 2008 (JP) ................................ 2008-242170
Sep. 29, 2008 (JP) ................................ 2008-251293

(51) Int. Cl.
*H05K 1/16* (2006.01)
(52) U.S. Cl. .................. 174/260; 174/261; 174/262
(58) Field of Classification Search ............... 257/778
See application file for complete search history.

(56) References Cited

U.S. PATENT DOCUMENTS

| | | | | |
|---|---|---|---|---|
| 5,378,859 | A | * | 1/1995 | Shirasaki et al. ............. 174/261 |
| 6,049,122 | A | * | 4/2000 | Yoneda .......................... 257/668 |
| 6,340,797 | B1 | | 1/2002 | Yoshida et al. |
| 7,432,602 | B2 | * | 10/2008 | Kuramochi .................... 257/783 |
| 7,521,799 | B2 | * | 4/2009 | Hayashi et al. ............... 257/738 |
| 2009/0236131 | A1 | * | 9/2009 | Mok et al. ..................... 174/257 |

FOREIGN PATENT DOCUMENTS

| | | |
|---|---|---|
| JP | 11074637 A | 3/1999 |
| JP | 2000-244088 | 9/2000 |
| JP | 2000315843 A | 11/2000 |
| JP | 2008141109 A | 6/2008 |

OTHER PUBLICATIONS

Japanese language office action dated Jul. 5, 2012 and its partial English language translation issued in corresponding Japanese application 2008242170 cites the foreign patent documents above.

* cited by examiner

*Primary Examiner* — Ishwarbhai Patel
(74) *Attorney, Agent, or Firm* — DLA Piper LLP (US)

(57) ABSTRACT

A wiring board includes a plurality of circular semiconductor element connection pads deposited in a lattice form onto a mounting portion of an insulation substrate, their upper surfaces being connected to electrodes of a semiconductor element. A solder resist layer is deposited onto the insulation substrate, which covers the side surfaces of these pads and exposes the upper surfaces of these pads. The solder resist layer has a concave part whose bottom surface corresponds to at least all the upper surfaces of these pads.

3 Claims, 31 Drawing Sheets

(a)

(b)

(c)

(d)

(e)

(f)

(g)

(h)

(k)

(l)

(a)

(b)

(a)

(b)

(g)

(h)

(i)

(j)

(k)

(l)

(o)

(p)

WIRING BOARD AND MANUFACTURING METHOD THEREOF

Priority is claimed to Japanese Patent Application No. 2008-242170 filed on Sep. 22, 2008, No. 2008-251293 filed on Sep. 29, 2008, the disclosure of which is incorporated by reference in its entirety.

BACKGROUND OF THE INVENTION

1. Field of the Invention

The invention relates to a wiring board and a method of manufacturing the same, and, more particularly, to a wiring board suitable for mounting, for example, an area array type semiconductor element by flip-chip connection, and a method of manufacturing the same.

2. Description of Related Art

As a semiconductor integrated circuit element that is a semiconductor element, there has heretofore been a so-called area array type semiconductor integrated circuit element in which a large number of electrode terminals are arranged in a lattice form substantially the entire one main surface thereof.

As a method of mounting the above semiconductor integrated circuit element onto a wiring board, flip chip connection is employed. In the flip chip connection, firstly, the upper surface of a semiconductor element connection pad disposed on the wiring board is exposed correspondingly to the arrangement of the electrode terminals of the semiconductor integrated circuit element. Subsequently, the exposed upper surfaces of the semiconductor element connection pads and the electrode terminals of an semiconductor integrated circuit element are opposed to each other, and the electrical connection therebetween is made through conductive bumps composed of solder, metal, or the like.

Recently, there have been attempts to increase the mounting density of semiconductor elements or electronic components onto a wiring board by flip-chip connection, and further mounting a different electronic component by a solder ball connection or a wire bond connection (for example, refer to patent document 1).

FIG. 30 is a schematic sectional view showing an example of conventional wiring boards in which an area array type semiconductor integrated circuit element as a semiconductor element is mounted by flip-chip connection, and a semiconductor element mounting substrate as another electronic component is mounted thereon by solder ball connection. FIG. 31 is a plan view showing the wiring board shown in FIG. 30.

As shown in FIG. 30, the conventional wiring board 110 has an insulation substrate 101. The insulation substrate 101 is constituted by laminating a plurality of build-up insulation layers 101b on the upper and lower surfaces of a core insulation substrate 101a. A core wiring conductor 102a and a build-up wiring conductor 102b are deposited onto the interior and the surface of the insulation substrate 101. A protective solder resist layer 103 is deposited onto the uppermost surface of the insulation substrate 101. A semiconductor element mounting portion 101A for mounting a semiconductor integrated circuit element E1 is formed on an upper surface mid part of the insulation substrate 101. An electronic component mounting portion 101B for mounting a semiconductor element mounting substrate E2 is formed on an upper surface outer peripheral part of the insulation substrate 101.

A plurality of through-holes 104 extend between the upper surface and the lower surface of the core insulation substrate 101a. The core wiring conductor 102a is deposited onto the upper and lower surfaces of the insulation substrate 101a and the inner surfaces of these through-holes 104. A plugged resin 105 fills the interior of these through-holes 104. A plurality of via holes 106 are formed in the plurality of build-up insulation layers 101b, respectively. The build-up wiring conductor 102b is formed by deposition on the surfaces of the individual insulation layers 101b and the inner surfaces of these via holes 106.

A part of the wiring conductor 102b which is deposited onto the outermost insulation layer 101b on the upper surface side of the wiring board 110 forms a semiconductor element connection pad 102A. The semiconductor element connection pad 102A is a circular pad electrically connected by flip-chip connection through a conductive bump B1 to an electrode terminal of the semiconductor integrated circuit element E1 in the semiconductor element mounting portion 101A. As shown in FIG. 31, a plurality of the semiconductor element connection pads 102A are arranged in a lattice form.

A part of the wiring conductor 102b which is deposited onto the outermost insulation layer 101b on the upper surface side of the wiring board 110 forms a electronic component connection pad 102B. The electronic component connection pad 102B is a circular pad electrically connected by solder ball connection through a solder ball B2 to an electrode terminal of the semiconductor element mounting substrate E2 as an electronic component in the electronic component mounting portion 101B. A plurality of the electronic component connection pads 102B are disposed side by side.

Outer peripheral parts 102A2 and 102B2 of the semiconductor element connection pads 102A and the electronic component connection pads 102B are covered with a solder resist layer 103, and the mid parts of the upper surfaces thereof are exposed from the solder resist layer 103. The electrode terminals of the semiconductor integrated circuit element E1 are electrically connected to exposed parts 102A1 of the semiconductor element connection pad 102A through the conductive bumps 81 composed of solder, metal, or the like. The electrode terminals of the semiconductor element mounting substrate E2 are electrically connected through the solder balls B2 to the exposed parts 102B1 of the electronic component connection pads 102B.

On the other hand, a part of the wiring conductor 102b which is deposited onto the outermost insulation layer 101b on the lower surface side of the wiring board 110 forms an external connection pad 102C. The external connection pad 102C is a circular pad electrically connected to a wiring conductor of an external electric circuit substrate. A plurality of the external connection pads 102C are arranged in a lattice form. The outer peripheral parts of these external connection pads 102C are covered with the solder resist layer 103. The upper surface mid parts of these external connection pads 102C are exposed from the solder resist layer 103. The wiring conductor of the external electric circuit substrate is electrically connected through a solder ball B3 to the exposed parts of the external connection pads 102C.

The solder resist layer 103 protects the outermost wiring conductor 102b, and defines the exposed parts of the semiconductor element connection pads 102A, the electronic component connection pads 102B and the external connection pads 102C, respectively. The solder resist layer 103 is formed as follows. Firstly, a thermosetting resin paste or a film having photosensitivity is laminated on the outermost insulation layer 101b where the wiring conductor 102b is formed. Subsequently, exposure and development are performed to cover the outer peripheral parts of the semiconductor element connection pads 102A and the electronic component connection pads 102B and the external connection pads 102C, and also have openings for exposing their respective mid parts, followed by curing.

Consequently, the exposed parts 102A1 and 102B1 of the semiconductor element connection pads 102A and the electronic component connection pads 102B are recessed from the surface of the solder resist layer 103. Further, the outer peripheral parts 102A2 and 102B2 of the semiconductor element connection pads 102A and the electronic component connection pads 102B are buried under the solder resist layer 103 with a predetermined width.

After the electrode terminals of the semiconductor integrated circuit element E1 and the semiconductor element connection pads 102A are electrically connected to each other through the conductive bumps B1, a filling resin U1 called underfill composed of a thermosetting resin, such as epoxy resin, is filled into the space between the semiconductor integrated circuit element E1 and the wiring board 110, thereby mounting the semiconductor integrated circuit element E1 onto the wiring board 110. Further thereon, the electrode terminals of the semiconductor element mounting substrate E2 and the electronic component connection pads 102B are electrically connected to each other through the solder balls B2, thereby mounting the semiconductor element mounting substrate E2 onto the wiring board 110. This achieves high-density mounting of semiconductor elements and the electronic components onto the wiring board 110.

Recently, the high integration of the semiconductor integrated circuit element E1 has been advanced rapidly, and the arrangement pitch of the electrode terminals on the semiconductor integrated circuit element E1 becomes narrower (for example, less than 150 μm). Accordingly, the arrangement pitch of the semiconductor element connection pads 102A, to which the electrode terminals of the semiconductor integrated circuit element E1 are connected by flip-chip connection, also becomes narrower (for example, less than 150 μm).

For achieving the narrow pitch of the semiconductor element connection pads 102A, it is unavoidable to decrease at least one of the diameter of the semiconductor element connection pads 102A and the distance between the adjacent semiconductor element connection pads 102A and 102A. When the diameter of the semiconductor element connection pads 102A is decreased, the diameter of the exposed parts 102A1 from the solder resist layer 103 in the semiconductor element connection pad 102A is correspondingly decreased. When the diameter of the exposed parts 102A1 is small, the development during the formation of the solder resist layer 103 becomes insufficient, and the resin residue of the solder resist layer 103 becomes liable to remain at the exposed parts 102A1. Additionally, the connection area between the semiconductor integrated circuit element E1 and the conductor bump B1 becomes small, making it difficult to firmly and satisfactorily connect the electrode terminals of the semiconductor integrated circuit element E1 and the semiconductor element connection pads 102A through the conductor bumps B1.

For achieving satisfactory connection between the semiconductor integrated circuit element E1 and the semiconductor element connection pads 102A, without leaving the resin residue of the solder resist layer 103 on the exposed part 102A1 of the semiconductor element connection pads 102A, it is desirable to set the diameter of each of the exposed parts 102A1 to not less than 70 μm.

It is usually necessary that the width of the solder resist layer 103 covering the outer peripheral parts 102A2 of the semiconductor element connection pads 102A be not less than 15 μm in terms of positioning accuracy between the semiconductor element connection pads 102A and solder resist layer 103. Therefore, when it is ensured that the diameter of the exposed part 102A1 is approximately 70 μm, the diameter of the semiconductor element connection pads 102A is approximately 100 μm.

For example, in the case where the arrangement pitch of the semiconductor element connection pad 102A is 140 μm, if the diameter of the semiconductor element connection pads 102A is 100 μm, the distance between the adjacent semiconductor element connection pads 102A and 102A is 40 μm. If the distance between the adjacent semiconductor element connection pads 102A and 102A is 40 μm, it becomes difficult to form, for example, a strip-shaped wiring conductor having a width of approximately 15 μm within this distance, while ensuring a sufficient distance of approximately 15 μm between the opposite semiconductor element connection pads 102A.

The following problem may arise when the strip-shaped wiring conductor cannot be formed between the adjacent semiconductor element connection pads 102A and 102A. That is, the strip-shaped wiring conductor extending outside of the mounting portion 101A cannot be disposed from the plurality of semiconductor element connection pads 102A arranged in the lattice form, except for the semiconductor element connection pads 102A lying on the outermost periphery, and hence the degree of freedom in the design of the wiring board 110 is lowered.

Patent document 1: Japanese Unexamined Patent Application Publication No. 2000-244088

SUMMARY OF THE INVENTION

One advantage of the invention is to provide a wiring board for mounting an area array type semiconductor element by flip-chip connection, and a method of manufacturing the same. Even if the arrangement pitch of semiconductor element connection pads for connecting electrodes of the semiconductor element is a narrow pitch, the electrode terminals of the semiconductor element and the semiconductor element connection pads can be connected to each other firmly and satisfactorily through a conductive bump, while ensuring a sufficiently large area of exposed parts of the semiconductor element connection pads which are exposed from a solder resist layer.

Other advantage of the invention is to provide a wiring board for mounting an area array type semiconductor element by flip-chip connection, having a high degree of freedom of design, and a method of manufacturing the same. That is, even if the arrangement pitch of the semiconductor element connection pads for connecting the electrodes of the semiconductor element is a narrow pitch, a strip-shaped wiring conductor can be formed between the adjacent semiconductor element connection pads while ensuring a sufficient distance between the opposite semiconductor element connection pads.

The wiring board of the invention is provided with an insulation substrate having on its upper surface a mounting portion for mounting a semiconductor element; a plurality of circular semiconductor element connection pads comprising a plating layer which are deposited in a lattice form on the mounting portion of the insulation substrate, electrodes of the semiconductor element being connected to upper surfaces of the semiconductor element connection pads through conductive bumps; and a solder resist layer deposited onto the insulation substrate, the solder resist layer covering side surfaces of the semiconductor element connection pads and exposing the upper surfaces of the semiconductor element connection pads. The solder resist layer has a concave part whose bottom surface corresponds to at least all the upper surfaces of the semiconductor element connection pads.

The method of manufacturing a wiring board of the invention includes the step of forming a plurality of circular semiconductor element connection pads comprising a plating layer in a lattice form on a mounting portion for mounting a semiconductor element, the mounting portion lying on an upper surface of an insulation substrate; the step of depositing onto the insulation substrate a resin layer for a solder resist layer for burying the semiconductor element connection pads; and the step of forming a solder resist layer by partially removing the resin layer, the solder resist layer covering side surfaces of the semiconductor element connection pads and having a concave part whose bottom surface corresponds to at least all the upper surfaces of the semiconductor element connection pads.

Other method of manufacturing a wiring board includes the step of forming a plurality of circular semiconductor element connection pads comprising a plating layer in a lattice form on a mounting portion for mounting a semiconductor element, the mounting portion lying on an upper surface of an insulation substrate; and forming an electronic component connection pad comprising a plating layer on the upper surface in outside of the mounting portion; the step of depositing onto the insulation substrate a resin layer for a solder resist layer for burying the semiconductor element connection pads and the electronic component connection pad; and the step of forming a solder resist layer by partially removing the resin layer, the solder resist layer covering side surfaces of the semiconductor element connection pads and a side surface of the electronic component connection pad, and having a concave part whose bottom surface corresponds to at least all the upper surfaces of the semiconductor element connection pads, and having an opening for exposing an upper surface mid part of the electronic component connection pad.

Other wiring board of the invention is provided with an insulation substrate having on its upper surface a mounting part for mounting a semiconductor element; a plurality of circular semiconductor element connection pads comprising a plating layer which are deposited in a lattice form onto the mounting portion of the insulation substrate, electrodes of the semiconductor element being connected to upper surfaces of the semiconductor element connection pads through conductive bumps; a plurality of strip-shaped wiring conductors comprising a plating layer which are deposited onto the upper surface of the insulation substrate and extend from the semiconductor element connection pads to outside of the mounting portion; and a solder resist layer deposited onto the insulation substrate so as to cover the strip-shaped wiring conductors, the solder resist layer exposing the upper surfaces of the semiconductor element connection pads and adhering to side surfaces of the semiconductor element connection pads. The upper surfaces of the semiconductor element connection pads protrude above upper surfaces of the strip-shaped wiring conductors and are exposed from the solder resist layer. The dimension from the upper surface to the lower surface of each of the semiconductor element connection pads is identical.

Other method of manufacturing a wiring board of the invention includes the step of depositing a base plating layer comprising an electroless plating layer onto the whole of an upper surface of an insulation substrate having on the upper surface a mounting portion for mounting a semiconductor element; the step of depositing onto the base plating layer a first plating mask having a plurality of circular openings for forming semiconductor element connection pads lying on the mounting portion and opening in a lattice form, and having a plurality of openings for forming strip-shaped wiring conductors which open from the openings for forming the semiconductor element connection pads to outside of the mounting portion; the step of forming a first plating layer comprising an electrolytic plating layer on the base plating layer exposed within the openings for forming the semiconductor element connection pads and exposed within the openings for forming the strip-shaped wiring conductors; the step of depositing onto the first plating mask a second plating mask for exposing the openings for forming the semiconductor element connection pads and covering the openings for forming the strip-shaped wiring conductors; the step of forming a second plating layer comprising an electrolytic plating layer on the first plating layer exposed within the openings for forming the semiconductor element connection pads; the step of removing the first plating mask and the second plating mask and then etching away the base plating layer except for an area covered with the first plating layer; forming a plurality of circular semiconductor element connection pads comprising the base plating layer and the first plating layer and the second plating layer at positions corresponding to the openings for forming the semiconductor element connection pads, a dimension from the upper surface to the lower surface of each of the semiconductor element connection pads being identical; and forming a plurality of strip-shaped wiring conductors comprising the base plating layer and the first plating layer at positions corresponding to the openings for forming the strip-shaped wiring conductors; the step of forming on the insulation substrate a solder resist layer for burying the semiconductor element connection pads and the strip-shaped wiring conductors; and the step of ablating at least a part of the solder resist layer until the upper surfaces of the semiconductor element connection pads are exposed.

Other method of manufacturing a wiring board of the invention includes the step of depositing a base plating layer comprising an electroless plating layer onto the whole of an upper surface of an insulation substrate having on the upper surface a mounting portion for mounting a semiconductor element; the step of depositing onto the base plating layer a first plating mask having a plurality of circular openings for forming semiconductor element connection pads lying on the mounting portion and opening in a lattice form, and having a plurality of openings for forming strip-shaped wiring conductors which open from the openings for forming the semiconductor element connection pads to outside of the mounting portion, and having an opening for forming an electronic component connection pad lying outside of the mounting portion; the step of forming a first plating layer comprising an electrolytic plating layer on the base plating layer exposed within the openings for forming the semiconductor element connection pads and exposed within the openings for forming the strip-shaped wiring conductors, and exposed within the opening for forming the electronic component connection pad; the step of depositing onto the first plating mask and the first plating layer, a second plating mask for exposing the openings for forming the semiconductor element connection pads, and covering the opening for forming the strip-shaped wiring conductors and the opening for forming the electronic component connection pad; the step of forming a second plating layer comprising an electrolytic plating layer on the first plating layer exposed within the openings for forming the semiconductor element connection pads; the step of removing the first plating mask and the second plating mask and then etching away the base plating layer except for an area covered with the first plating, layer; forming a plurality of circular semiconductor element connection pads comprising the base plating layer and the first plating layer and the second plating layer at positions corresponding to the openings for forming the semiconductor element connection pads, a dimension from the upper surface to the lower surface of each of the semiconductor element connection pads being identical; forming a plurality of strip-shaped wiring conductors comprising the base plating layer and the first plating layer at positions corresponding to the openings for forming the strip-shaped wiring conductors; and forming an electronic component connection pad comprising the base plating layer and the first plating layer at a position corresponding to the opening for forming the electronic component connection pad; the step of forming on the insulation substrate a solder resist layer which buries the semiconductor element connection pads and the strip-shaped wiring conductors and has an opening for exposing an upper surface mid part of the electronic component connection pad; and the step of ablating at least a part of the solder resist layer until the upper surfaces of the semiconductor element connection pads are exposed.

In accordance with the wiring board and the method of manufacturing the wiring board, the solder resist layer covering the side surfaces of the semiconductor element connection pads and exposing their upper surfaces has the concave part whose bottom surface corresponds to at least all the upper surfaces of the semiconductor element connection pads. Consequently, the diameter of these semiconductor element connection pads can be reduced while ensuring a sufficient exposed area of the upper surfaces of these semiconductor element connection pads which are exposed from the solder resist layer. This provides the wiring board allowing for a sufficiently large exposed area of the upper surfaces of these semiconductor element connection pads which are exposed from the solder resist layer even if the arrangement pitch of these semiconductor element connection pads is a narrow pitch, for example, less than 150 μm, thereby achieving firm and satisfactory connection between the electrodes of the semiconductor element and the semiconductor element connection pads through the conductive bumps.

Other method of manufacturing the wiring board of the invention provides the wiring board that achieves, in addition to the above effect, high-density mounting of semiconductor elements of narrow pitch electrode and other electronic components.

In accordance with other wiring board and the method of manufacturing the wiring board, the upper surfaces of the semiconductor element connection pads protrude above the upper surfaces of the strip-shaped wiring conductors which extend from the semiconductor element connection pads to outside of the mounting portion and are covered with the solder resist layer, and are exposed from the solder resist layer. Additionally, the dimension from the upper surface to the lower surface of each of the semiconductor element connection pads is identical. Consequently, the diameter of these semiconductor element connection pads can be reduced while ensuring a sufficient exposed area of the upper surfaces of these semiconductor element connection pads which are exposed from the solder resist layer. Hence, even if the arrangement pitch of these semiconductor element connection pads is a narrow pitch, for example, less than 150 μm, a large distance between the adjacent semiconductor element connection pads can be ensured, and the strip-shaped wiring conductors covered with the solder resist layer can be formed therebetween, keeping a sufficient distance between the adjacent semiconductor element connection pads. This provides the wiring substrate having a high degree of freedom of design.

Other method of manufacturing other wiring board of the invention including forming the electronic component connection pad provides the wiring board that achieves, in addition to the above effect, high-density mounting of semiconductor elements of narrow pitch electrode and other electronic components.

DETAILED DESCRIPTION OF THE PREFERRED EMBODIMENTS

<First Preferred Embodiment>

The wiring board according to the first preferred embodiment of the invention mounts an area array type semiconductor integrated circuit element as a semiconductor element by flip-chip connection, and further mounts thereon a semiconductor element mounting substrate as another electronic component by solder ball connection. The wiring board according to the first preferred embodiment of the invention will be described below in detail with reference to FIGS. 1 and 2.

Figure 1:
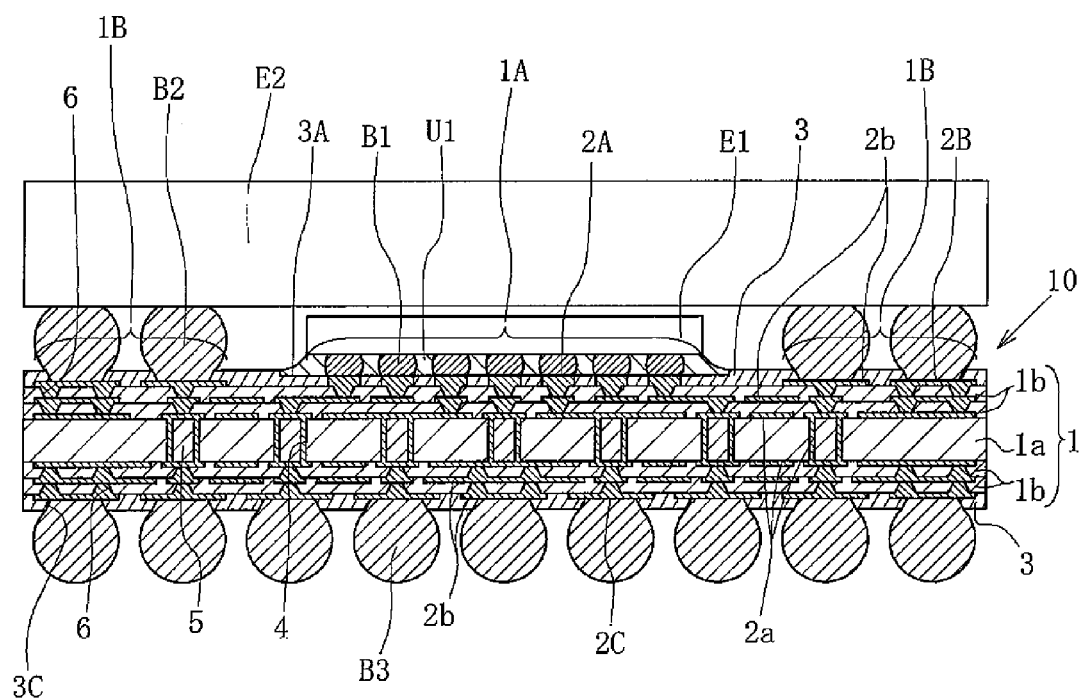
FIG. 1 is a schematic sectional view showing a wiring board according to a first preferred embodiment of the invention.
Figure 2:
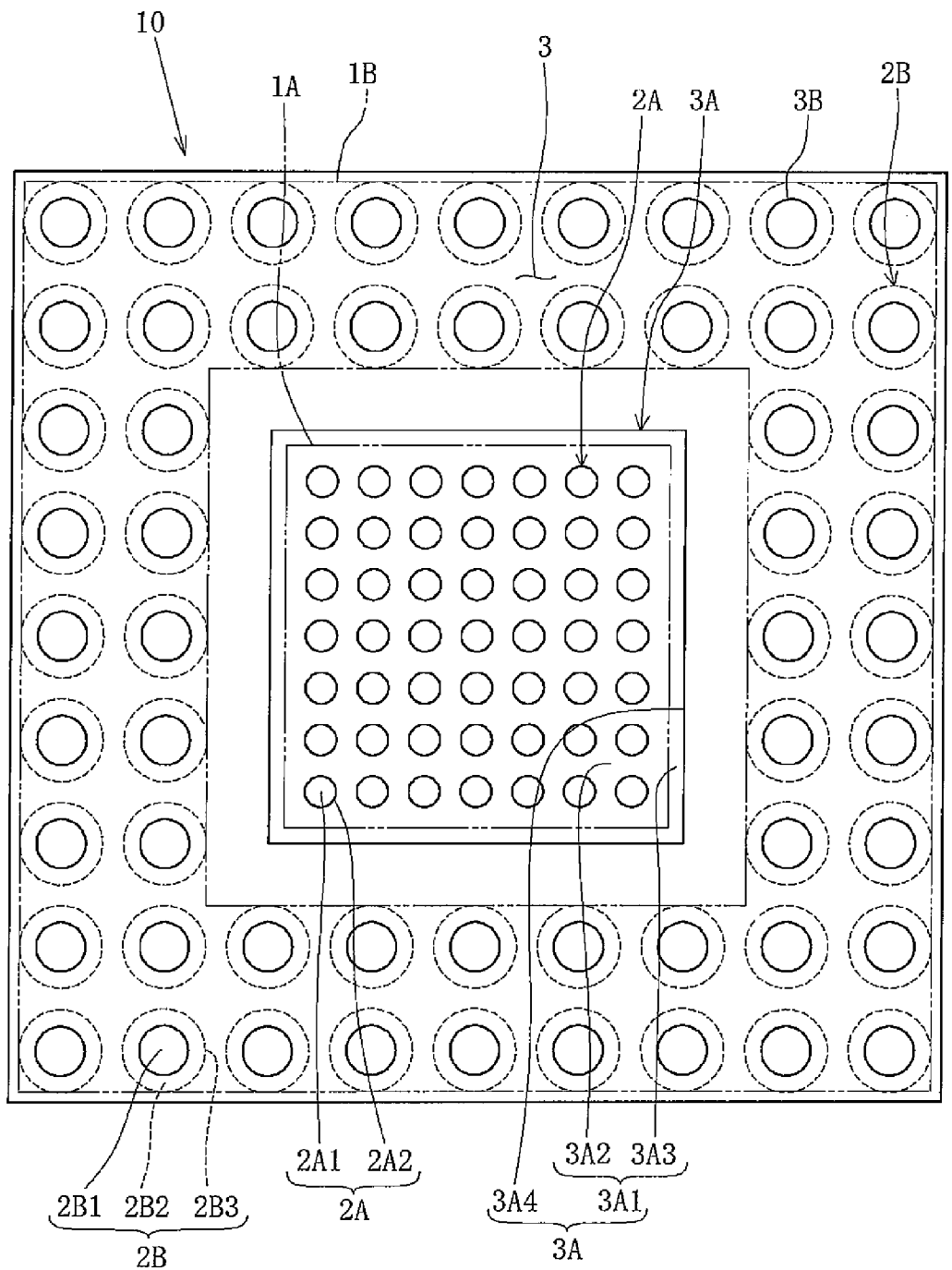
FIG. 2 is a plan view showing the wiring board in FIG. 1.
Figure 3:
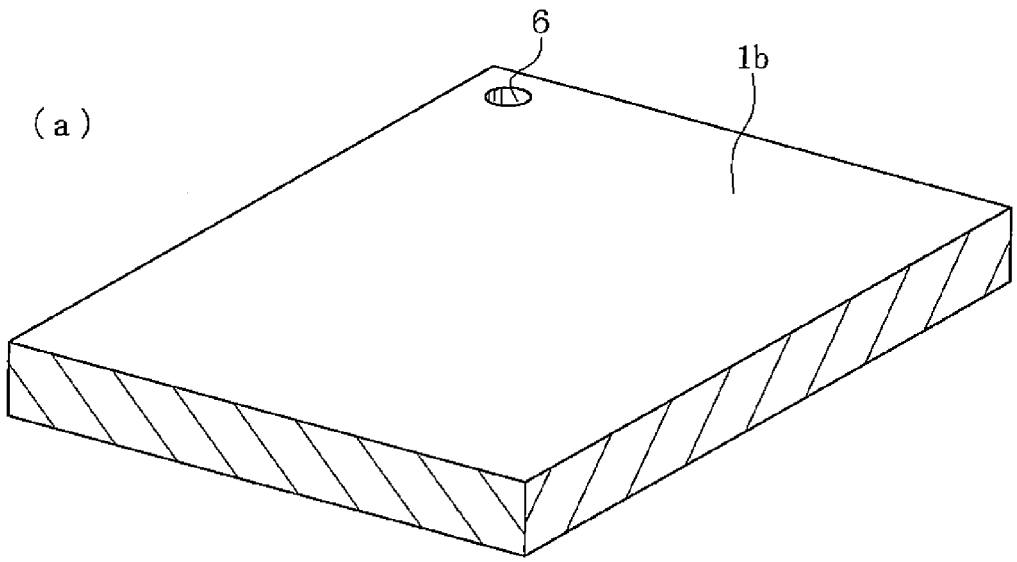
FIGS. 3(a) and 3(b) are schematic explanatory drawings showing a method of manufacturing the wiring board of the first preferred embodiment.
Figure 3:
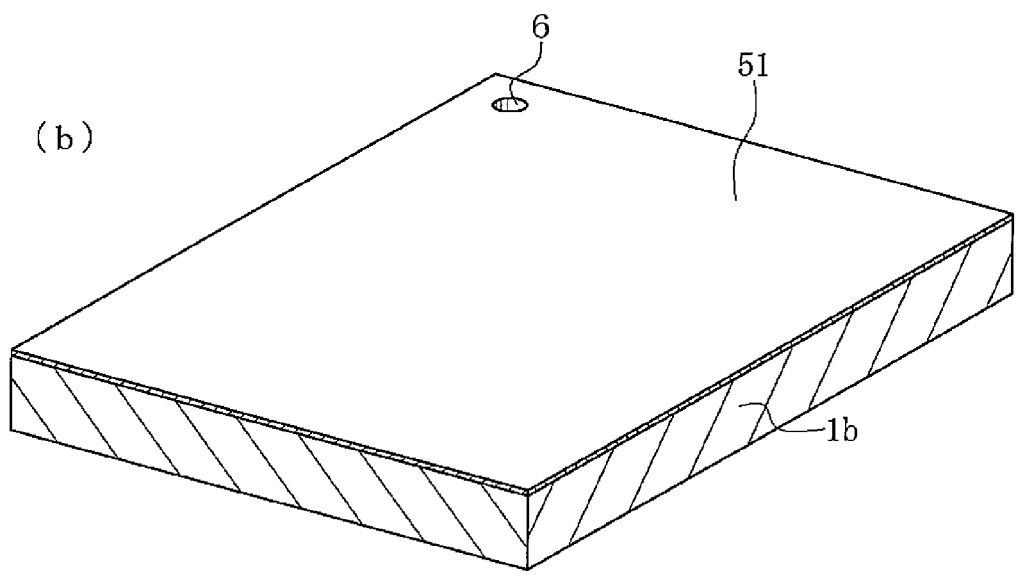
Figure 4:
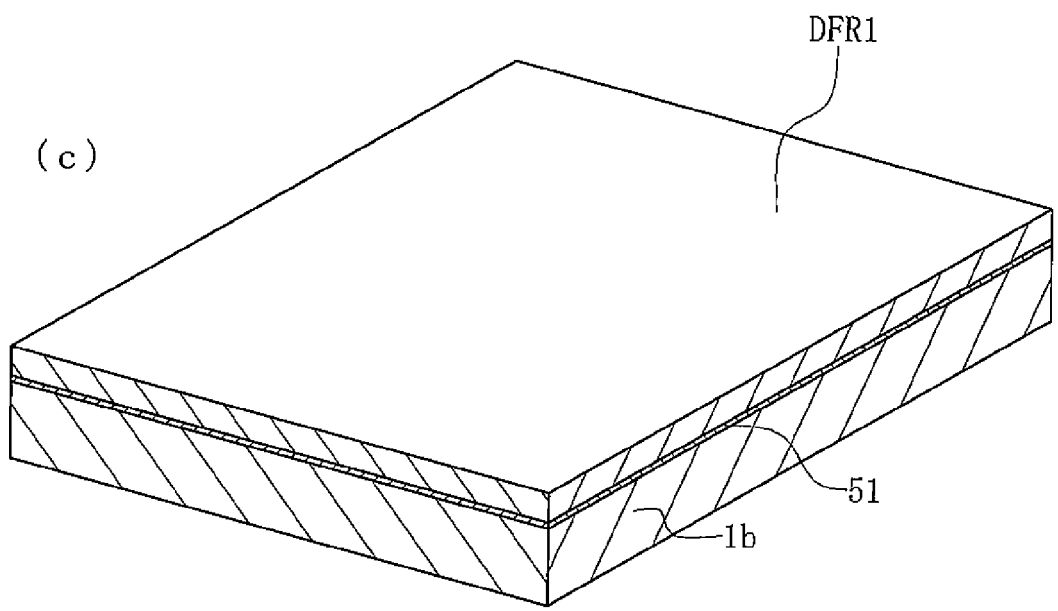
FIGS. 4(c) and 4(d) are schematic explanatory drawings showing the method of manufacturing the wiring board of the first preferred embodiment.
Figure 4:
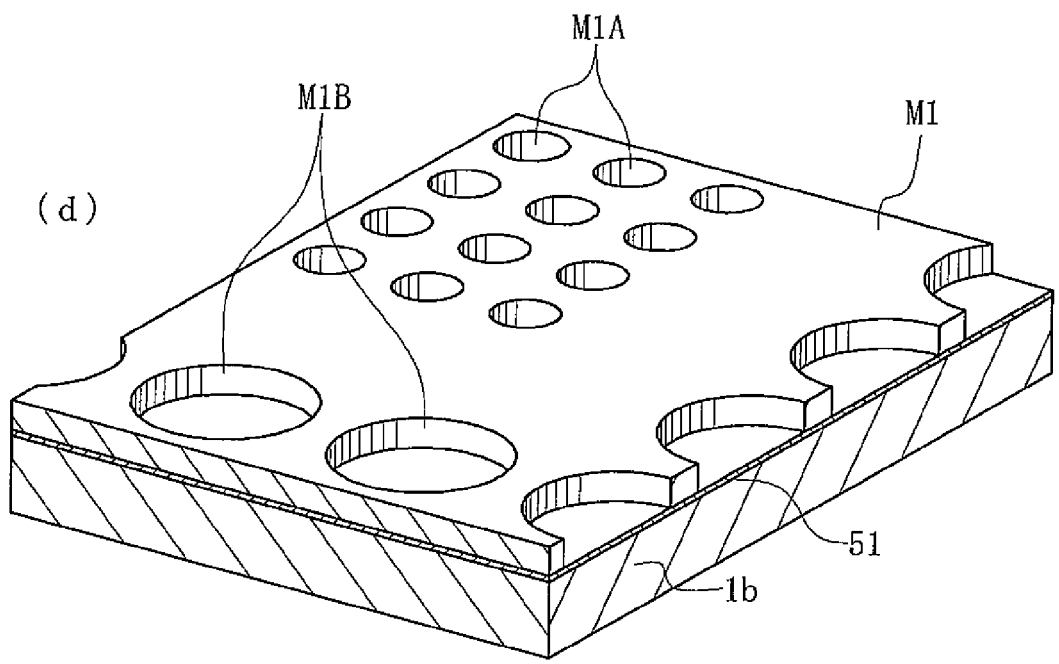
Figure 5:
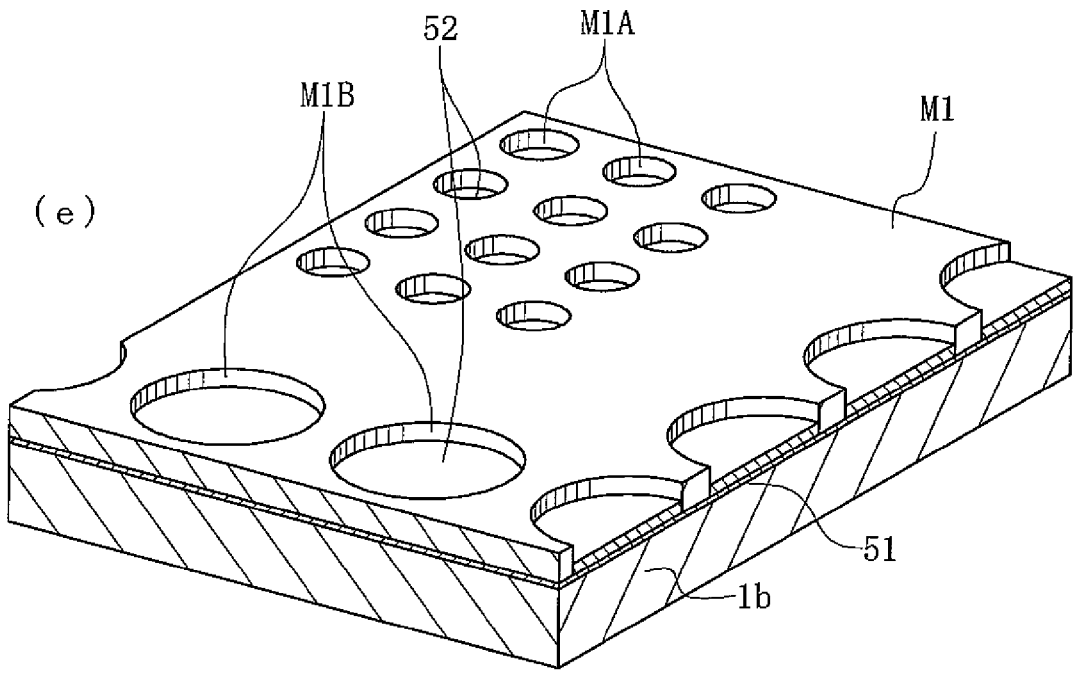
FIGS. 5(e) and 5(f) are schematic explanatory drawings showing the method of manufacturing the wiring board of the first preferred embodiment.
Figure 5:
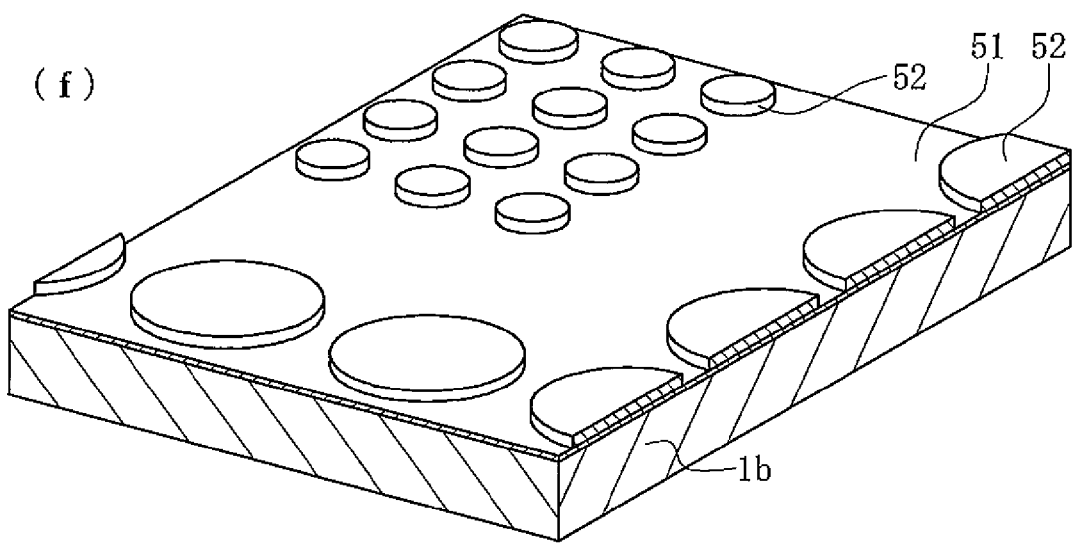
Figure 6:
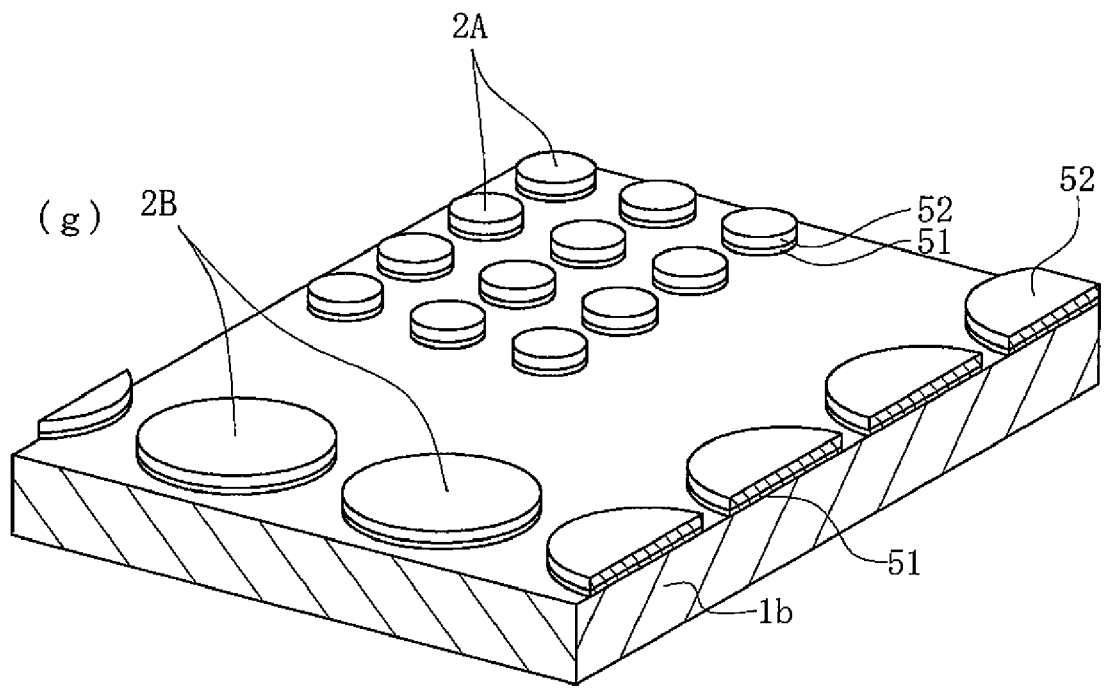
FIGS. 6(g) and 6(h) are schematic explanatory drawings showing the method of manufacturing the wiring board of the first preferred embodiment.
Figure 6:
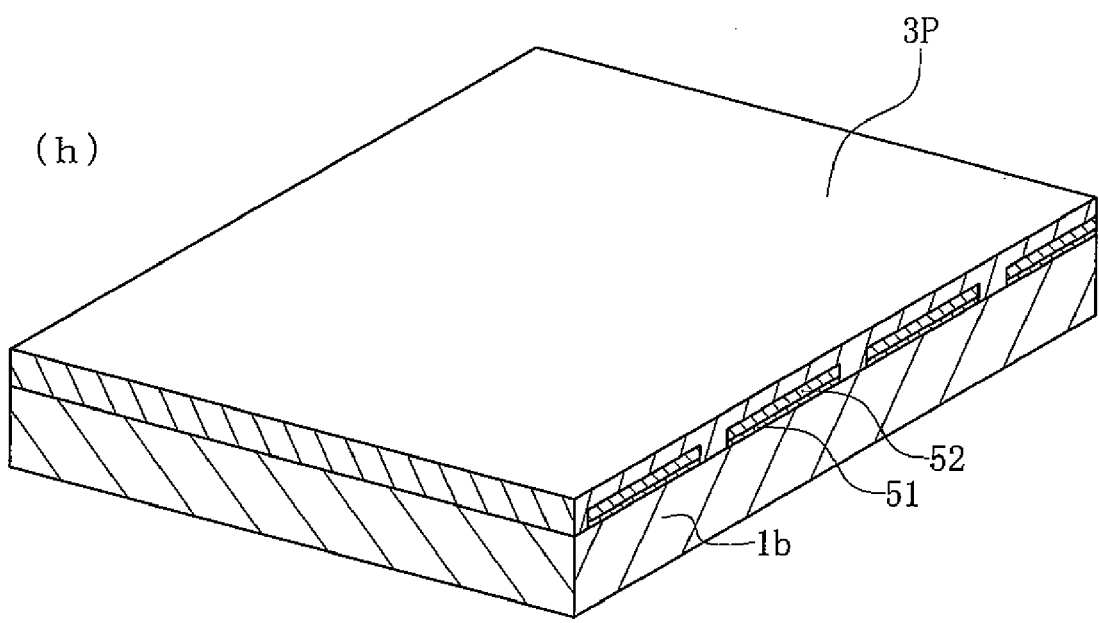
Figure 7:
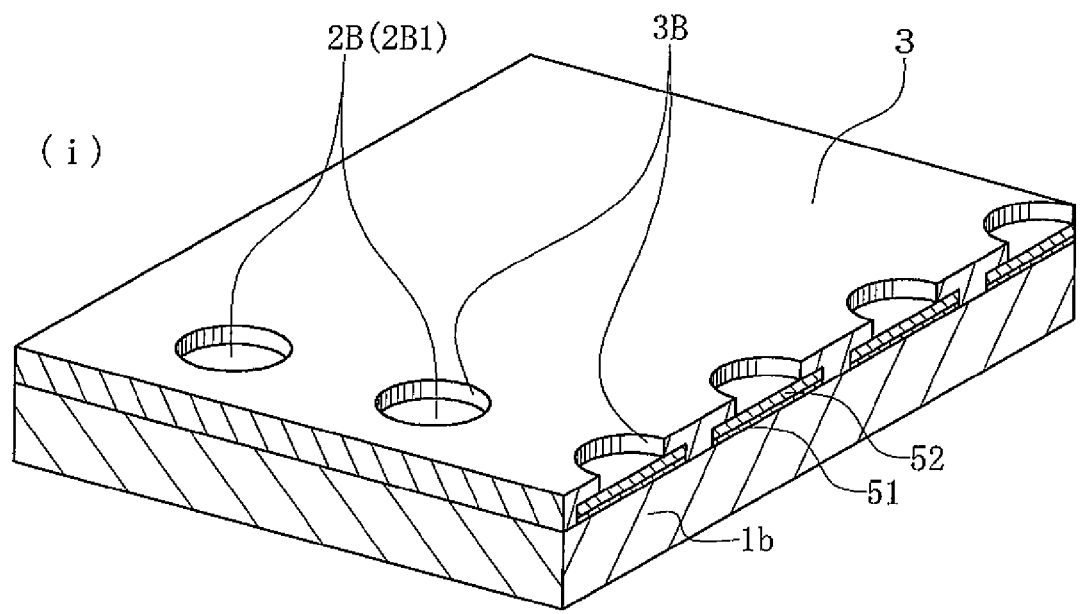
FIGS. 7(i) and 7(j) are schematic explanatory drawings showing the method of manufacturing the wiring board of the first preferred embodiment.
Figure 7:
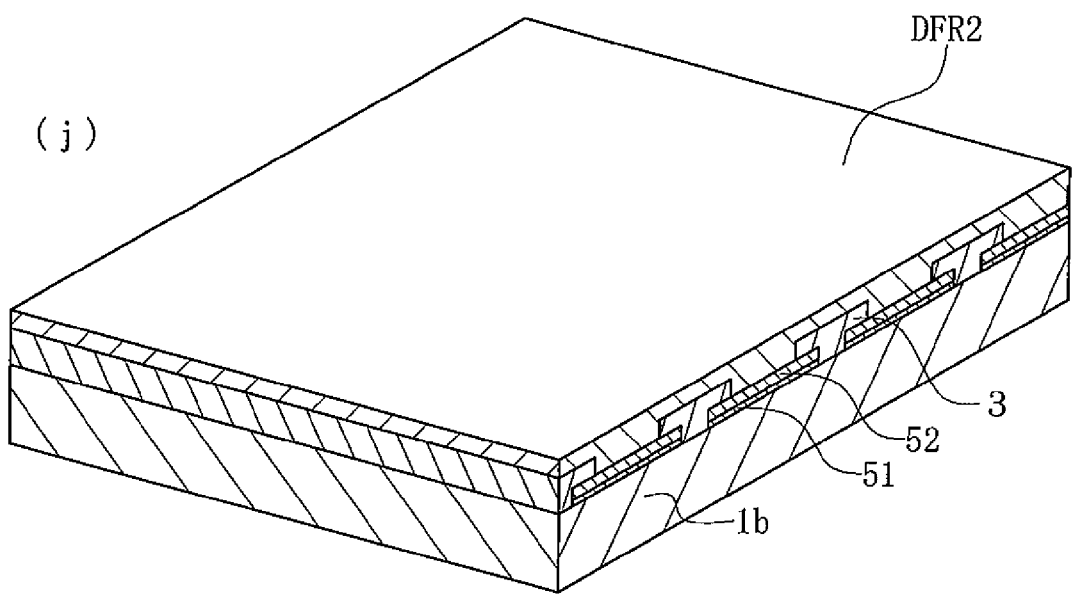
Figure 8:
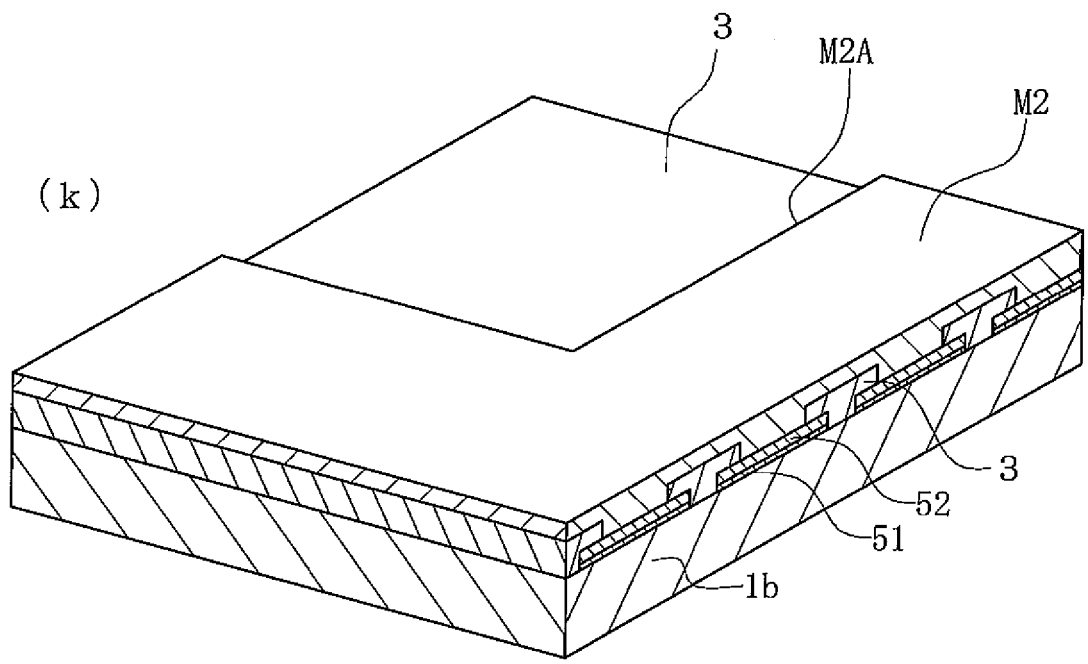
FIGS. 8(k) and 8(l) are schematic explanatory drawings showing the method of manufacturing the wiring board of the first preferred embodiment.
Figure 8:
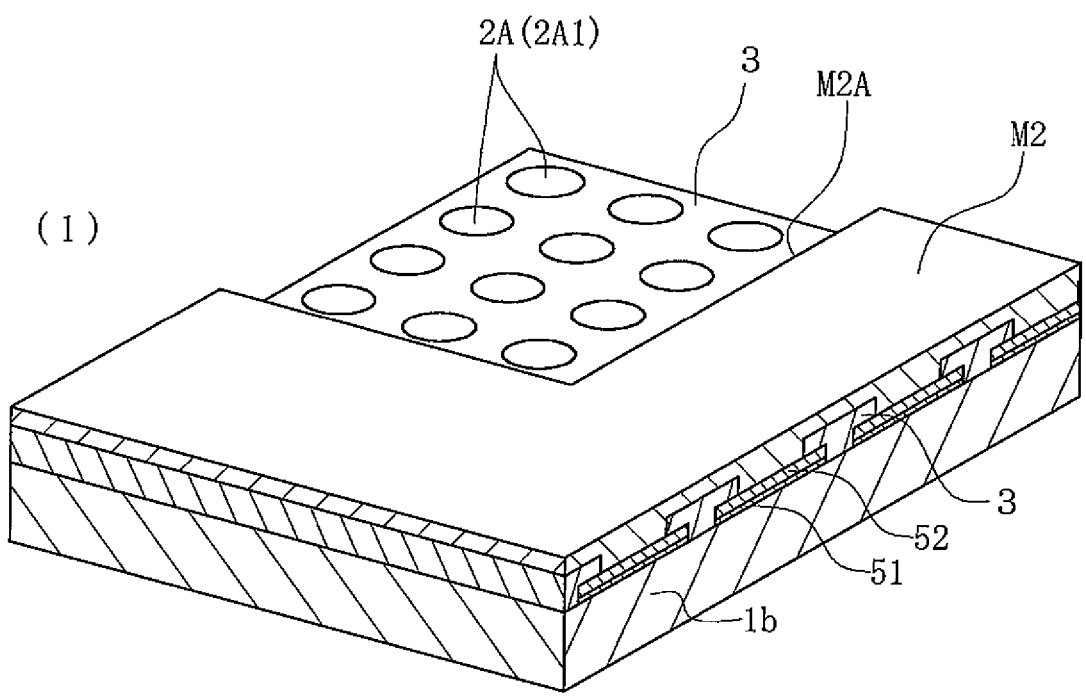
Figure 9:
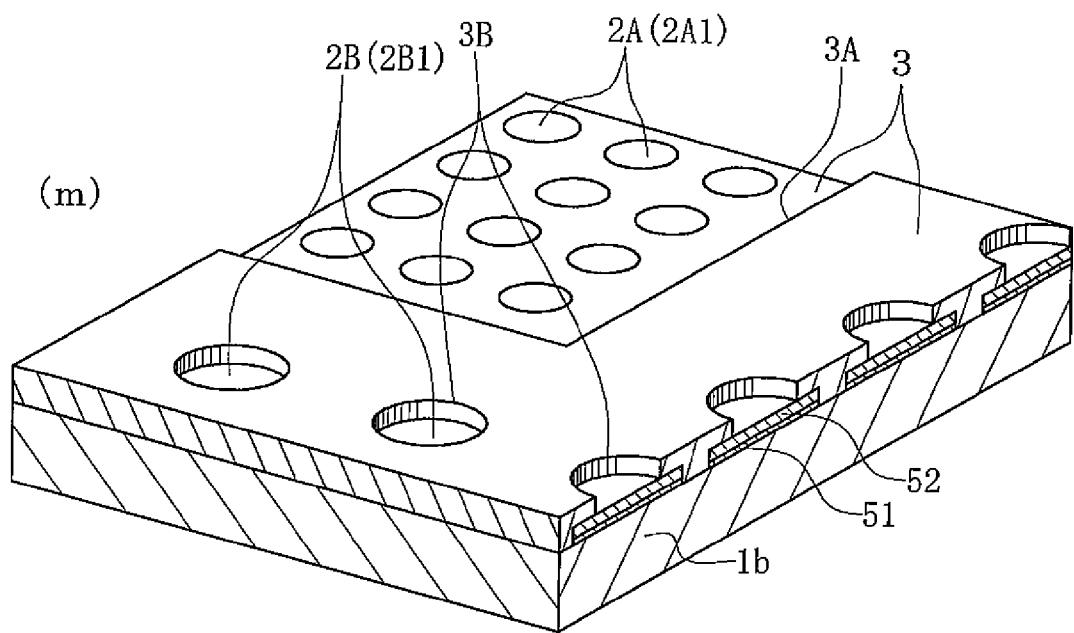
FIG. 9(m) is a schematic explanatory drawing showing the method of manufacturing the wiring board of the first preferred embodiment.

As shown in FIGS. 1 and 2, the wiring board 10 of the present preferred embodiment has an insulation substrate 1. The insulation substrate 1 is constituted by laminating a plurality of build-up insulation layers 1b on the upper and lower surfaces of a core insulation substrate 1a. A core wiring conductor 2a and a build-up wiring conductor 2b are deposited onto the interior and the surface of the insulation substrate 1. A protective solder resist layer 3 is deposited onto the uppermost surface of the insulation substrate 1. A semiconductor element mounting portion 1A for mounting a semiconductor integrated circuit element E1 is formed on an upper surface mid part of the insulation substrate 1. An electronic component mounting portion 1B for mounting a semiconductor element mounting substrate E2 is formed on an upper surface outer peripheral part of the insulation substrate 1.

The core insulation substrate 1a functions as a core member of the insulation substrate 1. The insulation substrate 1a has a thickness of approximately 0.05 to 1.5 mm. The insulation substrate 1a is composed of, for example, an electrical insulating material in which a glass cloth formed by vertically and horizontally weaving glass fiber bundles is impregnated with thermosetting resin such as bismaleimide-triazine resin or epoxy resin.

A plurality of through-holes 4 having a diameter of approximately 0.05 to 0.3 mm extend between the upper surface and the lower surface of the core insulation substrate 1a. The core wiring conductor 2a is deposited onto the upper and lower surfaces of the insulation substrate 1a and the inner surfaces of these through-holes 4. The wiring conductor 2a lying on the upper and lower surfaces of the insulation substrate 1a is mainly formed of copper foil or electroless copper plating and the overlying electrolytic copper plating, and the wiring conductor 2a lying on the inner surfaces of the through-holes 4 is formed of electroless copper plating and the overlying electrolytic copper plating.

A plugged resin 5 composed of thermosetting resin such as epoxy resin fills the interior of the through-holes 4. Wiring conductors 2a and 2a formed on the upper and lower surfaces of the insulation substrate 1a, respectively, are electrically connected to each other through the wiring conductor 2a within the through-holes 4.

The insulation substrate 1a is manufactured by sticking a copper foil for the wiring conductor 2a onto the upper and lower surfaces of a sheet in which a glass cloth is impregnated with an uncured thermosetting resin, and then thermally curing the sheet, followed by drilling the through-holes 4 between the upper and lower surfaces.

For example, the wiring conductor 2a is formed as follows. Firstly, as described above, copper foils having a thickness of approximately 2 to 18 μm are stuck onto the entire upper and lower surfaces of the above sheet for the insulation substrate 1a, respectively, and the through-holes 4 are drilled through these copper foils and the insulation substrate 1a. Subsequently, electroless copper plating and electrolytic copper plating are sequentially carried out over the inner surfaces of these through-holes 4 and the surfaces of these copper foils. The interior of these through-holes 4 is then filled with a plugged resin 5. Thereafter, these copper foils and the copper plating on the upper and lower surfaces are etched into a predetermined pattern using photolithography techniques or the like. This results in the formation of the wiring conductors 2a on the upper and lower surfaces of the insulation substrate 1a and the inner surfaces of the through-holes 4.

The plugged resin 5 closes the through-holes 4, allowing the build-up insulation layer 1b to be formed immediately above and immediately below the through-holes 4. For example, the plugged resin 5 is formed by filling uncured paste-like thermosetting resin into the through-holes 4 by screen printing method or the like, and then thermally curing this, followed by grinding the upper and lower surfaces thereof substantially flat.

A plurality of build-up insulation layers 1b laminated on the upper and lower surfaces of the insulation substrate 1a have a thickness of approximately 20 to 60 μm. Similarly to the insulation substrate 1a, the insulation layers 1b are composed of an electrical insulating material in which a glass cloth is impregnated with thermosetting resin, or an electrical insulating material made by dispersing inorganic filler such as silicon oxide into thermosetting resin such as epoxy resin. A plurality of via holes 6 having a diameter of approximately 30 to 100 μm are formed in the individual insulating layers 1b. A build-up wiring conductor 2b is deposited onto the surfaces of the individual insulating layers 1b and into these via holes 6.

For example, these insulating layers 1b can be formed as follows. Firstly, a resin sheet containing uncured thermosetting resin composition is stuck onto the surface of the insulation substrate 1a provided with the wiring conductor 2a, and the surfaces of the insulation layers 1b provided with the wiring conductor 2b. Subsequently, the resin sheet is thermally cured, and these via holes 6 are drilled by performing laser processing onto predetermined positions thereof. This results in the formation of the individual insulation layers 1b.

The build-up wiring conductors 2b are composed of electroless copper plating and the overlying electrolytic copper plating. High-density wiring in three dimensions is achieved by electrically connecting, through the wiring conductors 2b within the via holes 6, the wiring conductors 2b lying on the upper layer and the wiring conductors 2a or the wiring conductors 2b lying on the lower layer with the insulation layer 1b interposed therebetween.

The above wiring conductors 2b have a thickness of approximately 5 to 20 μm, and can be formed by so-called semi-additive method, for example. In the semi-additive method, for example, a base plating layer for electrolytic plating is firstly formed by electroless copper plating on the surface of the insulation layer 1b provided with the via holes 6. Subsequently, a plating resist layer having openings corresponding to the wiring conductors 2b is formed thereon. The wiring conductors 2b are formed through electrolytic copper plating over the base plating layer exposed from the openings by using the base plating layer as a power supply electrode. After the plating resist layer is peeled off, the exposed base plating layer is etched away so that the individual wiring conductors 2b are electrically independent of one another.

A part of the wiring conductor 2b which is deposited on the outermost insulation layer 1b on the upper surface side of the wiring board 10 forms a semiconductor element connection pad 2A. The semiconductor element connection pad 2A is a circular pad that is electrically connected through a conductive bump B1, such as solder, to an electrode terminal of the semiconductor integrated circuit element E1 in the semiconductor element mounting portion 1A. In the present preferred embodiment, the term "circular" means to be circular when viewed from above. In the following, the term "circular" is similarly prescribed. A plurality of the semiconductor element connection pads 2A are arranged in a lattice form.

Side surfaces 2A2 of the semiconductor element connection pads 2A are covered with a solder resist layer 3 described later. All the upper surfaces 2A1 of the semiconductor element connection pads 2A are exposed from the solder resist layer 3. Hence, even if the arrangement pitch of the semiconductor element connection pads 2A is a narrow pitch of less than 150 μm, the necessary area for firm and satisfactory electrical connection with the electrode terminals of the semiconductor integrated circuit element E1 through the conductive bump B1 is ensured on the upper surfaces 2A1 of the semiconductor element connection pads 2A, while satisfactorily maintaining electrical insulating properties between the adjacent semiconductor element connection pads 2A and 2A. This provides the wiring board capable of firmly and satisfactorily connecting the electrode terminals of the semiconductor integrated circuit element E1 and the semiconductor element connection pads 2A through the conductive bumps B1, while ensuring a sufficiently large exposed area of the upper surfaces 2A1 of the semiconductor element connection pads 2A which are exposed from the solder resist layer 3.

The semiconductor element connection pads 2A have a thickness of approximately 10 to 30 μm. The arrangement pitch of these semiconductor element connection pads 2A is a narrow pitch of less than 150 μm, preferably 120 to 140 μm.

The diameter of the semiconductor element connection pads 2A is set to ensure a sufficient area. That is, the diameter of the semiconductor element connection pads 2A is set to make firm and satisfactory electrical connection with the electrode terminals of the semiconductor integrated circuit element E1 through the conductive bumps B1, while ensuring the sufficient distance between the adjacent semiconductor element connection pads 2A and 2A. The followings are specific examples of the diameter of the semiconductor element connection pads 2A. The diameter is set to approximately 80 to 100 μm when the arrangement pitch is 140 μm. The diameter is set to approximately 70 to 90 μm when the arrangement pitch is 130 μm. The diameter is set to approximately 60 to 80 μm when the arrangement pitch is 120 μm.

Another part of the wiring conductor 2b which is deposited onto the outermost insulation layer 1b on the upper surface side of the wiring board 10 forms a electronic component connection pad 2B. The electronic component connection pad 2B is a circular pads electrically connected by solder ball connection through a solder ball B2 to the electrode terminal of the semiconductor element mounting substrate E2 in the electronic component mounting portion 1B. A plurality of the electronic component connection pads 2B are arranged side by side.

Side surfaces 2B3 and upper surface outer peripheral parts 2B2 of these electronic component connection pads 2B are covered with the solder resist layer 3. Upper surface mid parts 2B1 of these electronic component connection pads 2B are exposed from the solder resist layer 3. This achieves high-density mounting of semiconductor elements of narrow pitch electrode and other electronic components onto the wiring board.

The electronic component connection pads 2B have a thickness of approximately 10 to 20 μm, and a diameter of approximately 200 to 450 μm. The electronic component connection pads 2B are formed on the upper surface outer peripheral part of the insulation substrate 1 into a frame-shape surrounding the semiconductor element connection pads 2A at an arrangement pitch of 400 to 650 μm.

A part of the wiring conductor 2b which is deposited onto the outermost insulation layer 1b on the lower surface side of the wiring board 10 forms an external connection pad 2C. The external connection pad 2C is an external connection pad electrically connected through a solder ball B3 to the wiring conductor of an external electrical circuit substrate. A plurality of the external connection pads 2C are arranged side by side.

The solder resist layer 3 is deposited onto the outermost insulation layer 1b. The solder resist layer 3 is a protection membrane for protecting the outermost wiring conductor 2b from heat or external environment. The solder resist layer 3 on the upper surface side is deposited to cover the side surfaces 2A2 of the semiconductor element connection pads 2A and the side surfaces 2B3 of the electronic component connection pads 2B and the upper surface outer peripheral parts 2B2, and also expose all the upper surfaces 2A1 of the semiconductor element connection pads 2A and the upper surface mid parts 2B1 of the electronic component connection pads 2B.

The solder resist layer 3 on the upper surface side has a concave part 3A whose bottom surface corresponds to at least all the upper surfaces 2A1 of the semiconductor element connection pads 2A. In the concave part 3A of the present preferred embodiment, a bottom surface 3A1 is made up of the whole of a region 3A2 corresponding to the semiconductor element mounting portion 1A, and its surrounding 3A3, and a side wall 3A4 is formed to surround the semiconductor element mounting portion 1A. With this arrangement, when a filling resin U1 is filled between the wiring board 10 and the semiconductor integrated circuit element E1, the side wall 3A4 of the concave part 3A functions as a dam for preventing overflow of the filling resin U1, thereby avoiding the unnecessary overflow of the filling resin U1 onto the outer peripheral part of the insulation substrate 1.

The side wall 3A4 of the concave part 3A is preferably disposed approximately 300 to 1300 μm outside the semiconductor element mounting portion 1A. If the concave part 3A disposed less than 300 μm outside, there is a risk of deterioration of operability when the filling resin U1 is filled between the wiring board 10 and the semiconductor integrated circuit element E1. Conversely, if the concave part 3A disposed greater than 1300 μm outside, there is a risk of unnecessary spread of the filling resin U1.

The depth of the concave part 3A is preferably approximately 5 to 15 μm. If the depth of the concave part 3A is less than 5 μm, there is a risk that when the filling resin U1 is filled between the wiring board 10 and the semiconductor integrated circuit element E1, the side wall 3A4 of the concave part 3A does not sufficiently function as the dam for preventing overflow of the filling resin U1, and hence a portion of the filling resin U1 flows toward the outer peripheral part of the insulation substrate 1. If it exceeds 15 μm, the workability of the solder resist layer 3 is deteriorated.

The solder resist layer 3 on the upper surface side has circular openings 3B for exposing the upper surface mid parts 2B1 of the electronic component connection pads 2B. Thereby, the upper surface outer peripheral parts 2B2 of the electronic component connection pads 2B are covered with the solder resist layer 3, and the upper surface mid parts 2B1 of the electronic component connection pads 2B are exposed from the solder resist layer 3.

The upper surface mid parts 2B1 of the electronic component connection pads 2B are exposed within the openings 3B disposed in the solder resist layer 3, and form the bottom surface of the concave part formed with the openings 3B. With this arrangement, when the semiconductor element mounting substrate E2 is mounted onto the wiring board 10, the solder balls B2 for connecting the electrode terminals of the semiconductor element mounting substrate E2 and the electronic component connection pads 2B can be satisfactorily positioned onto the electronic component connection pads 2B within the concave part, thus achieving satisfactory mounting of the semiconductor element mounting substrate E2 onto the wiring board 10.

The solder resist layer 3 on the lower surface side is deposited to cover the side surfaces of external connection pads 2C and also expose the mid parts of the external connection pads 2C. That is, the solder resist layer 3 on the lower surface side has circular openings 3C for exposing the lower surface mid parts of the external connection pads 2C. Thereby, the outer peripheral parts of the external connection pads 2C are covered with the solder resist layer 3, and the mid parts of the external connection pads 2C are exposed from the solder resist layer 3.

The semiconductor integrated circuit element E1 is mounted onto the wiring board 10 by electrically connecting the electrode terminals (less than 150 μm pitch) of the area array type semiconductor integrated circuit element E1 and the semiconductor element connection pads 2A through the conductive bumps B1 (flip-chip connection), and by filling resin U1 called underfill composed of thermosetting resin such as epoxy resin into the space between the semiconductor integrated circuit element E1 and the wiring board 10. Further, the semiconductor element mounting substrate E2 is mounted on the wiring board 10 by electrically connecting the electrode terminals of the semiconductor element mounting substrate E2 as an electronic component and the electronic component connection pads 2B through the solder balls B2 (solder ball connection). This achieves high-density mounting of semiconductor elements and electronic components onto the wiring board 10.

The method of manufacturing the wiring board 10 will be described below in detail with reference to FIG. 3(a) to FIG. 9, by illustrating the formations of the semiconductor element connection pads 2A, the electronic component connection pads 2B and the solder resist layer 3.

As shown in FIG. 3(a), a via hole 6 is formed in the outermost insulation layer 1b on the upper surface side. For example, carbon dioxide gas laser or YAG laser is employed for forming the via hole 6. Then, as shown in FIG. 3(b), a base plating layer 51 for electrolytic plating is deposited by electroless copper plating over the surface of the insulation layer 1b and the entire surface within the via hole 6. The electroless plating for forming the base plating layer 51 is preferably electroless copper plating.

As shown in FIG. 4(c), a first alkaline-developable photosensitive dry film resist DFR1 is stuck onto the surface of the base plating layer 51, and the DFR1 is then exposed and developed into a predetermined pattern using photolithography technique. As shown in FIG. 4(d), this results in the formation of a plating mask M1 having a plurality of openings M1B for forming semiconductor element connection pads having a shape corresponding to the semiconductor element connection pads 2A, and a plurality of openings M1B for forming electronic component connection pads having a shape corresponding to the electronic component connection pads 2B. Preferably, the thickness of the plating mask M1 is slightly larger than the thickness of the semiconductor element connection pads 2A and the thickness of the electronic component connection pads 2B to be formed later.

As shown in FIG. 5(e), a plating layer 52 having a shape corresponding to the semiconductor element connection pads 2A and the electronic component connection pads 2B is deposited by electrolytic plating method on the base plating layer 51 exposed within the openings M1A for forming semiconductor element connection pads and the openings M1B for forming electronic component connection pads in the plating mask M1. The electrolytic plating for forming the plating layer 52 is preferably electrolytic copper plating. The plating layer 52 is preferably thinner than the plating mask M1. Specifically, the thickness of the plating layer 52 is 8 to 20 μm, preferably 10 to 15 μm.

As shown in FIG. 5(f), the plating mask M1 is then removed. The plating mask M1 can be removed by means of immersion into an alkaline solution such as a sodium hydrate solution.

As shown in FIG. 6(g), the base plating layer 51 except for the area covered with the plating layer 52 is removed. This results in the formations of a plurality of the semiconductor element connection pads 2A and a plurality of the electronic component connection pads 2B, each of which is made up of the base plating layer 51 and the plating layer 52. In order to remove the base plating layer 51 except for the area covered with the plating layer 52, the base plating layer 51 exposed by removing the plating mask M1 may be etched away using etchant containing aqueous hydrogen peroxide, sodium persulfate, or the like.

As shown in FIG. 6(h), a resin layer 3P for a solder resist layer covering the semiconductor element connection pads 2A and the electronic component connection pads 2B is deposited over the entire surface of the outermost insulation layer 1b on the upper surface side. As the resin constituting the resin layer 3P, various kinds of known resins functioning as a solder resist layer for protecting the surface of the wiring board can be employed. The deposited resin layer 3P is exposed and developed into a predetermined pattern using photolithography techniques. This results in the formation of a solder resist layer 3 having openings 3B for exposing the upper surface mid parts 2B1 of the electronic component connection pads 2B, as shown in FIG. 7(i).

As shown in FIG. 7(j), a second alkaline-developable photosensitive dry film resist DFR2 covering these openings 3B is stuck onto the entire surface of the solder resist layer 3, and the DRF2 is then exposed and developed into a predetermined pattern using photolithography techniques. This results in the formation of a ablation mask M2 having openings M2A for exposing at least the area corresponding to the semiconductor element connection pads 2A and the surroundings thereof on the upper surface of the solder resist layer 3, as shown in FIG. 8(k).

In the present preferred embodiment, there are formed the openings M2A for collectively exposing the whole of the area corresponding to the semiconductor element mounting portion 1A and the surroundings thereof. The openings M2A of the ablation mask M2 are preferably dimensioned to expose the area extending outward beyond the semiconductor element mounting portion 1A by approximately 300 to 1300 μm. The thickness of the ablation mask M2 on the solder resist layer 3 is preferably not less than 15 μm.

As shown in FIG. 8(l), the solder resist layer 3 exposed from the openings M2A of the ablation mask M2 is then ablated until all the upper surfaces 2A1 of the semiconductor element connection pads 2A are exposed. The ablation may be carried out by employing any one of various kinds of known mechanical ablation methods including wet blasting method, and laser scribing method.

The ablation mask M2 is then removed. For example, the ablation mask M2 can be removed by means of immersion into an alkaline solution such as a sodium hydrate solution. The ablation mask M2 is thus removed to thereby complete the wiring board 10 in which all the upper surfaces 2A1 of the semiconductor element connection pads 2A are exposed within the concave part 3A formed in the solder resist layer 3, and the upper surface mid parts 2B1 of the electronic component connection pads 2B are exposed within the openings 3B formed in the solder resist layer 3, as shown in FIG. 9(m).

Figure 10:
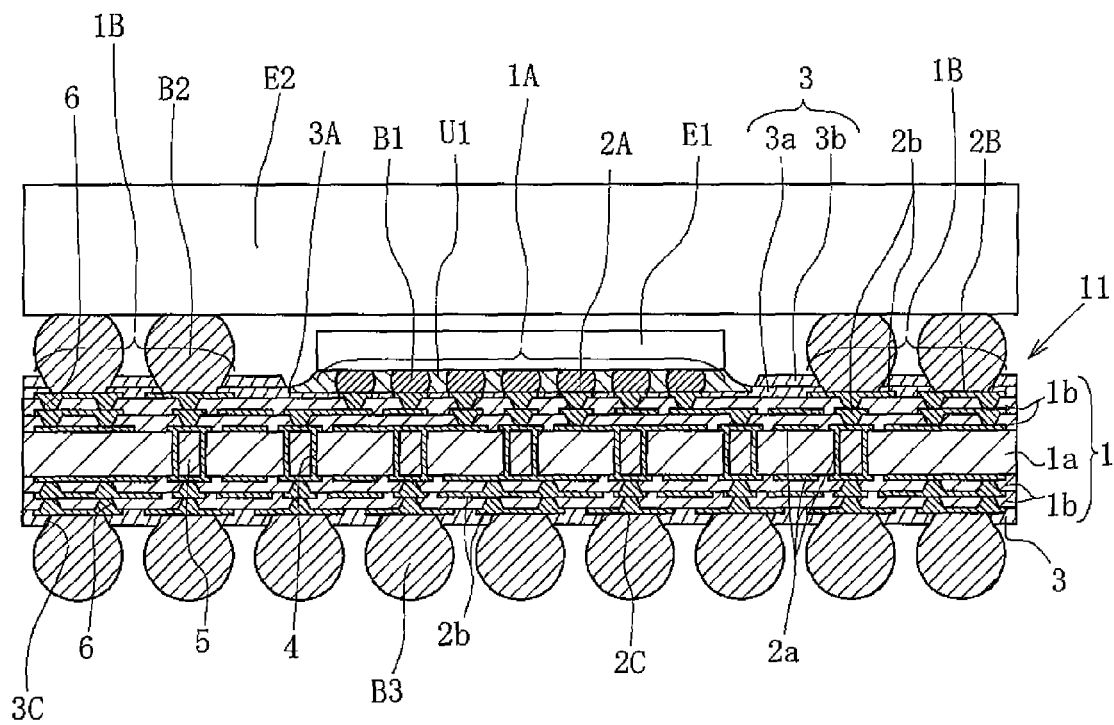
FIG. 10 is a schematic sectional view showing other example in the wiring board according to the first preferred embodiment of the invention.

Alternatively, the structure of the wiring board 10 may be changed into, for example, the structure of a wiring board 11 shown in FIG. 10. That is, though the foregoing preferred embodiment has illustrated the case of forming the solder resist layer 3 on the upper surface side by using a single resin layer 3P, the solder resist layer 3 on the upper surface side may have a two-layer structure made up of a lower solder resist layer 3a and an upper solder resist layer 3b.

Figure 11:
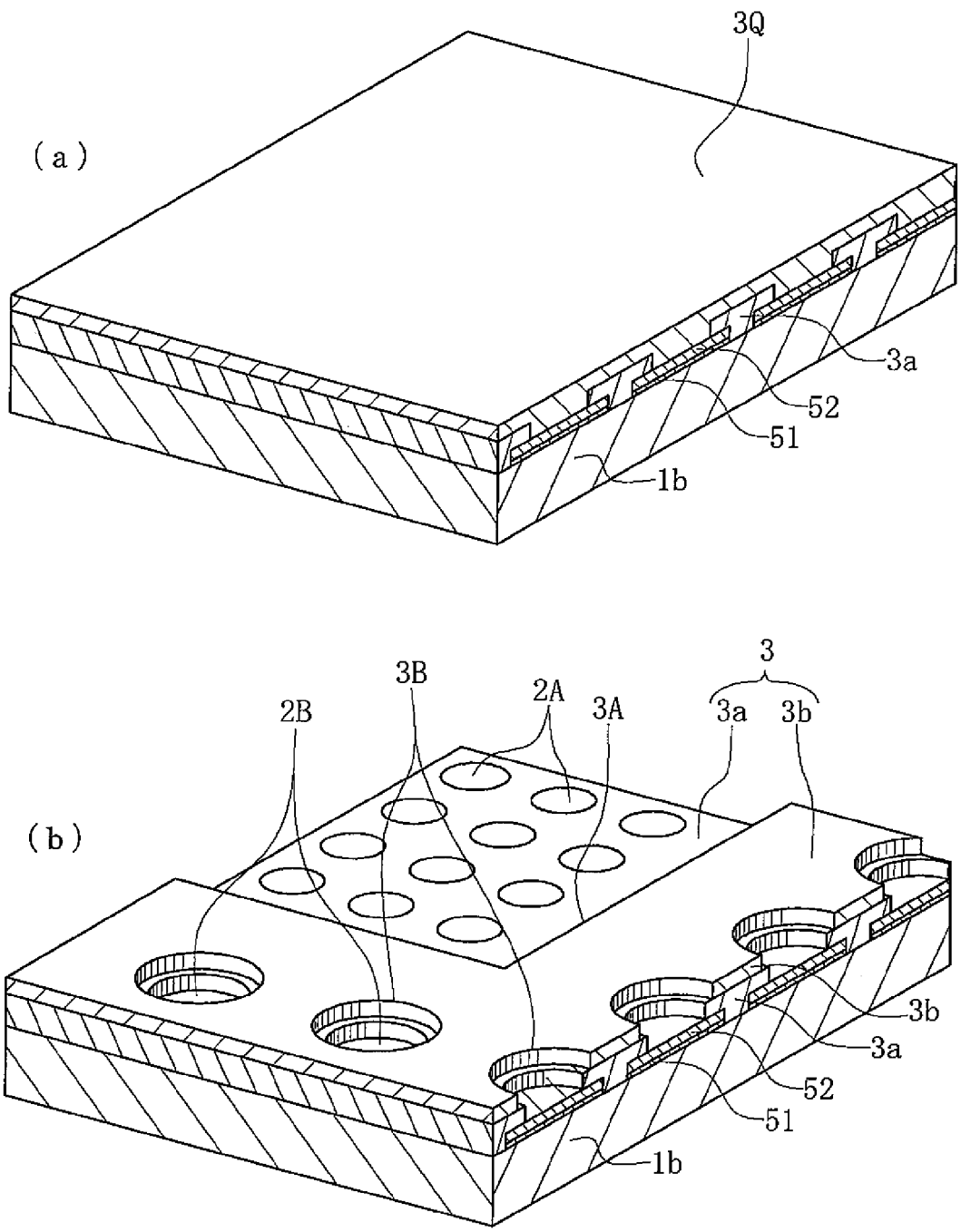
FIGS. 11(a) and 11(b) are schematic explanatory drawings showing a method of manufacturing the wiring board shown in FIG. 10.

For forming the solder resist layer 3 of the two-layer structure, firstly, the solder resist layer 3 formed in the step described with reference to FIG. 9(m) is used as the lower solder resist layer 3a. Subsequently, as shown in FIG. 11(a), a resin layer 3Q for a solder resist layer covering the semiconductor element connection pads 2A and the electronic component connection pads 2B is deposited onto the lower solder resist layer 3a. The resin layer 3Q is then exposed and developed into a predetermined pattern using photolithography techniques. Thus, the concave part 3A slightly larger than the concave part 3A in the lower solder resist layer 3a, and openings 3B slightly larger than the openings 3B in the lower solder resist layer 3a are formed in the upper solder resist layer 3b.

In the above case, the thickness of the lower solder resist layer 3a can be decreased, thereby enhancing the operability of ablation when the concave part 3A is formed in the lower solder resist layer 3a. Additionally, it is easy to increase the thickness of the solder resist layer 3 covering the outside of the mounting portion 1A. This enhances the electrical insulation reliability between the adjacent electronic component connection pads 2B and 2B. This also enhances the function of the side wall of the concave part 3A as the dam for preventing overflow of the filling resin U1 when the filling resin U1 is filled between the wiring board 11 and the semiconductor integrated circuit element E1. Otherwise, the structure is identical to that of the wiring board 10 described above.

Figure 12:
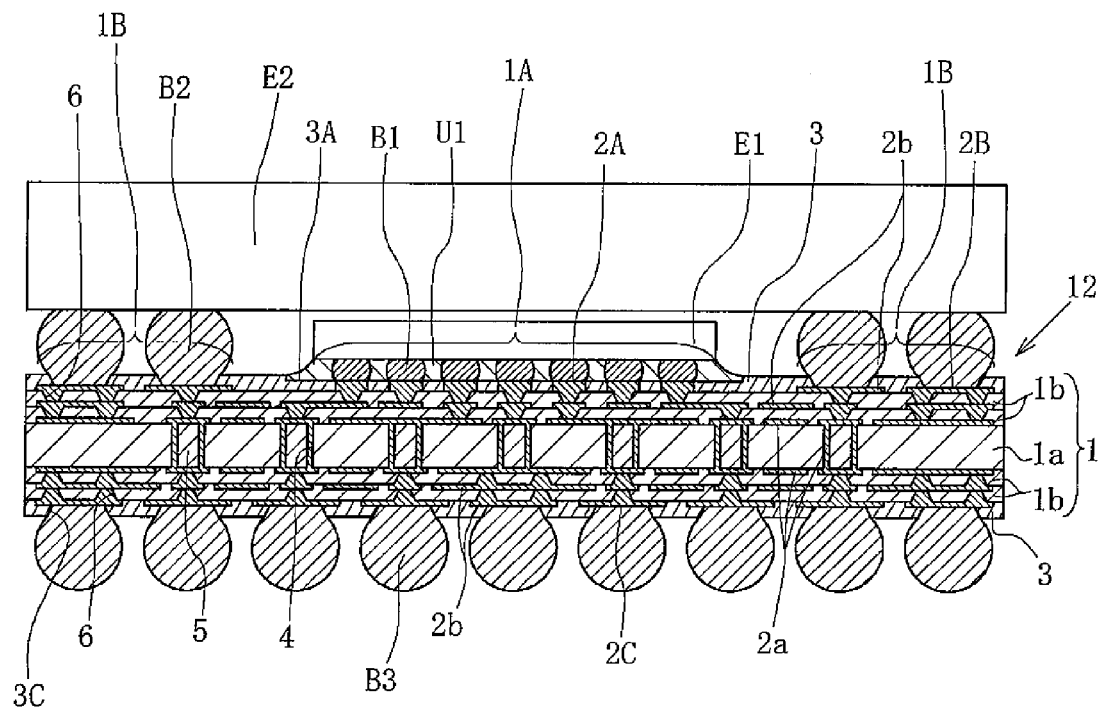
FIG. 12 is a schematic sectional view showing still another example in the wiring board according to the first preferred embodiment of the invention.

Alternatively, the structure of the wiring board 10 may be changed into, for example, the structure of a wiring board 12 shown in FIG. 12. That is, though the foregoing preferred embodiment has illustrated the case where the semiconductor element connection pads 2A and the electronic component connection pads 2B are made up of the base plating layer 51 and the plating layer 52, and have substantially the same thickness, the thickness of the semiconductor element connection pads 2A may be larger than the thickness of the electronic component connection pads 2B, as shown in FIG. 12.

Figure 13:
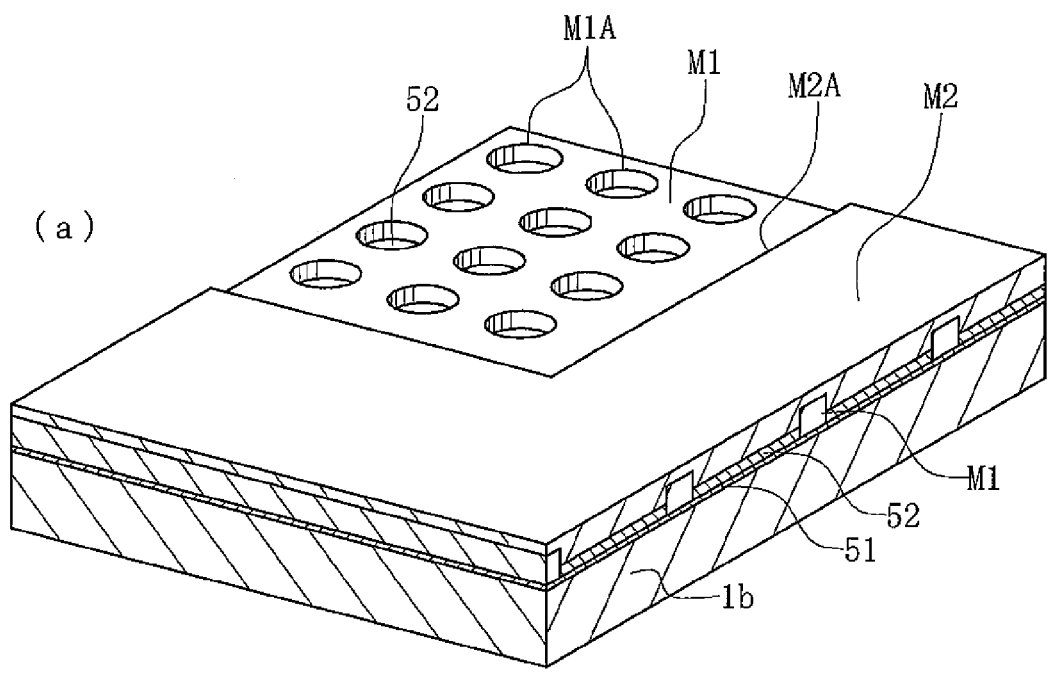
FIGS. 13(a) and 13(b) are schematic explanatory drawings showing a method of manufacturing the wiring board shown in FIG. 12.
Figure 13:
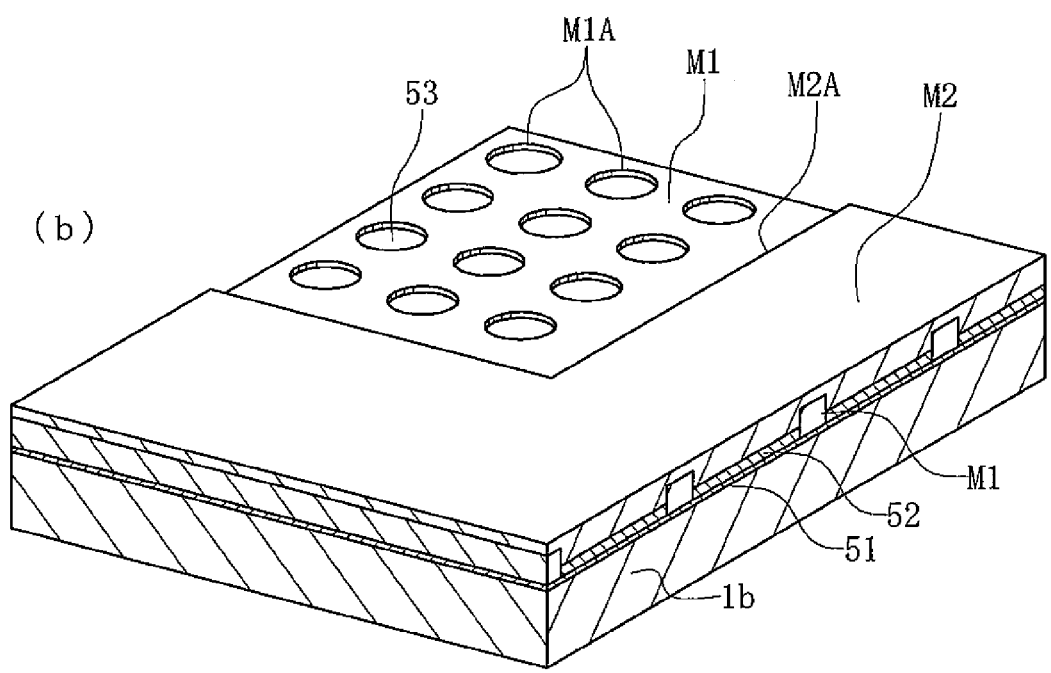
Figure 14:
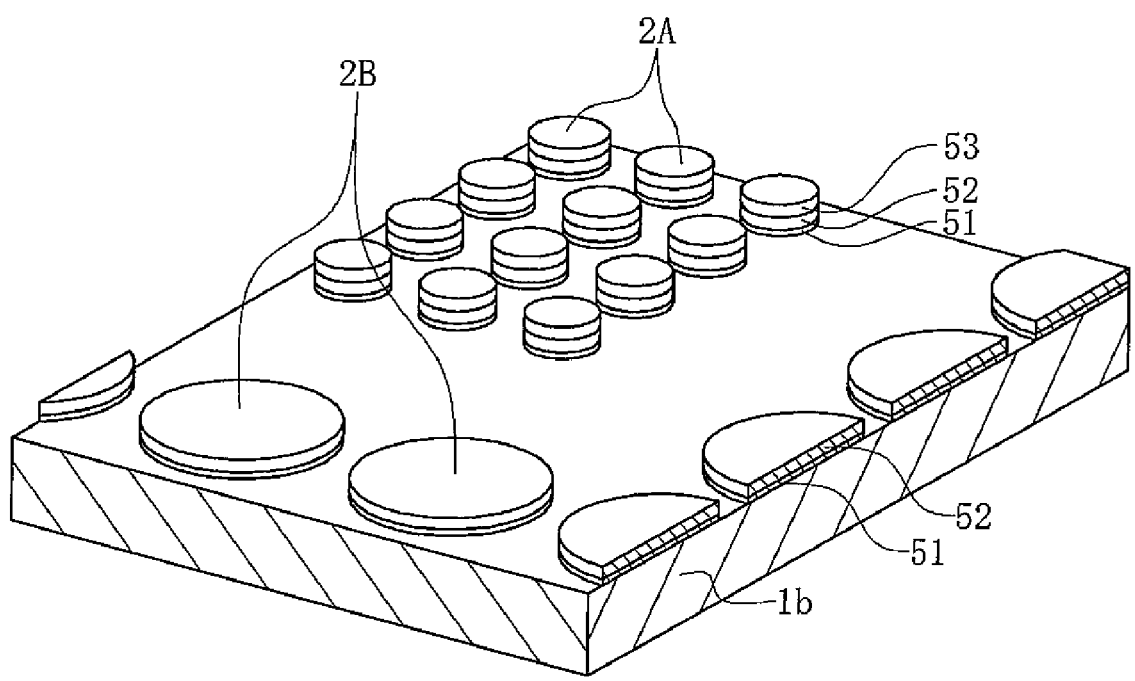
FIG. 14 is a schematic explanatory drawing showing the method of manufacturing the wiring board shown in FIG. 12.

In order to make the thickness of the semiconductor element connection pads 2A larger than the thickness of the electronic component connection pads 2B, firstly, the step described with reference to FIG. 5(e) is carried out. Then, as shown in FIG. 13(a), a second mask M2 for exposing openings M1A and covering openings M1B is formed by deposition onto a mask M1. As shown in FIG. 13(b), a second plating layer 53 is deposited by electrolytic plating onto the plating layer 52 exposed within the openings M1A of the mask M1. The mask M1 and the mask M2 are then removed, and the exposed base plating layer 51 is etched away. As shown in FIG. 14, this results in the formation of the semiconductor element connection pads 2A made up of the base plating layer 51 and the plating layer 52 and the second plating layer 53, and the electronic component connection pads 2B made up of the base plating layer 51 and the plating layer 52. Thereafter, the solder resist layer 3 is formed according to the steps described with reference to FIGS. 6(h) to 9(m).

In the above case, the upper surfaces of the semiconductor element connection pads 2A protrude above the upper surfaces of the electronic component connection pads 2B by the thickness of the second plating layer 53. This ensures a sufficient distance in a height direction between the semiconductor integrated circuit element E1 and the wiring board 12, thereby providing the wiring board having excellent filling performance of the filling resin U1. Otherwise, the structure is identical to that of the wiring board 10 described above.

Figure 15:
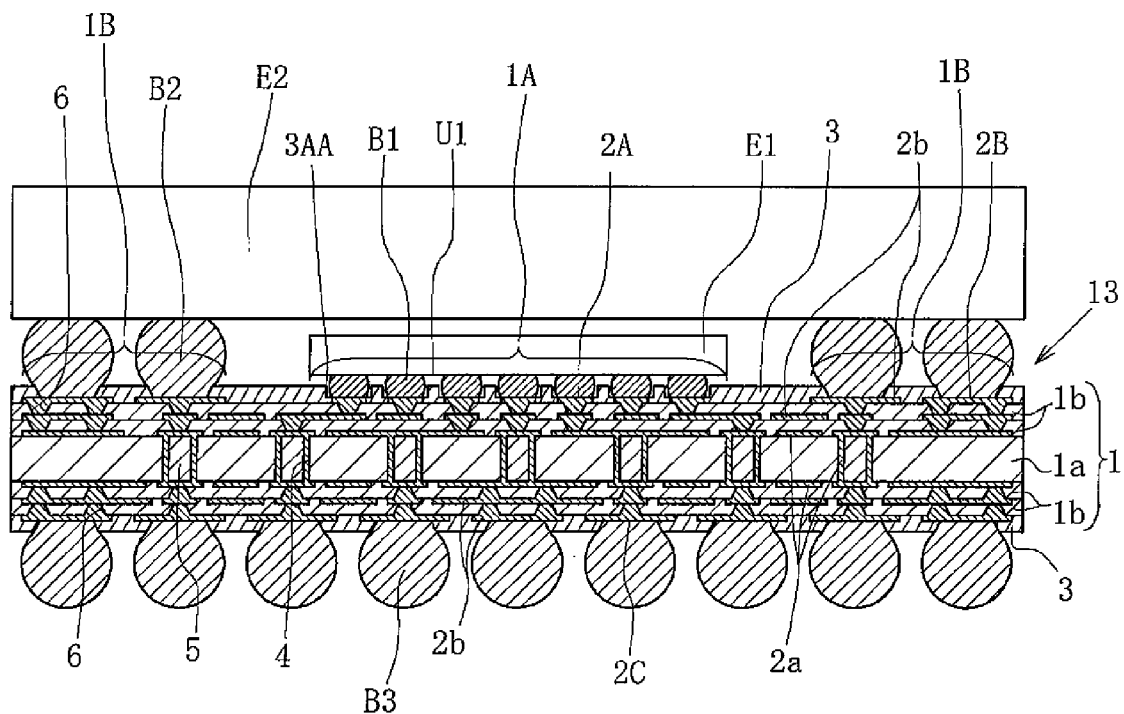
FIG. 15 is a schematic sectional view showing other example in the wiring board according to the first preferred embodiment of the invention.
Figure 16:
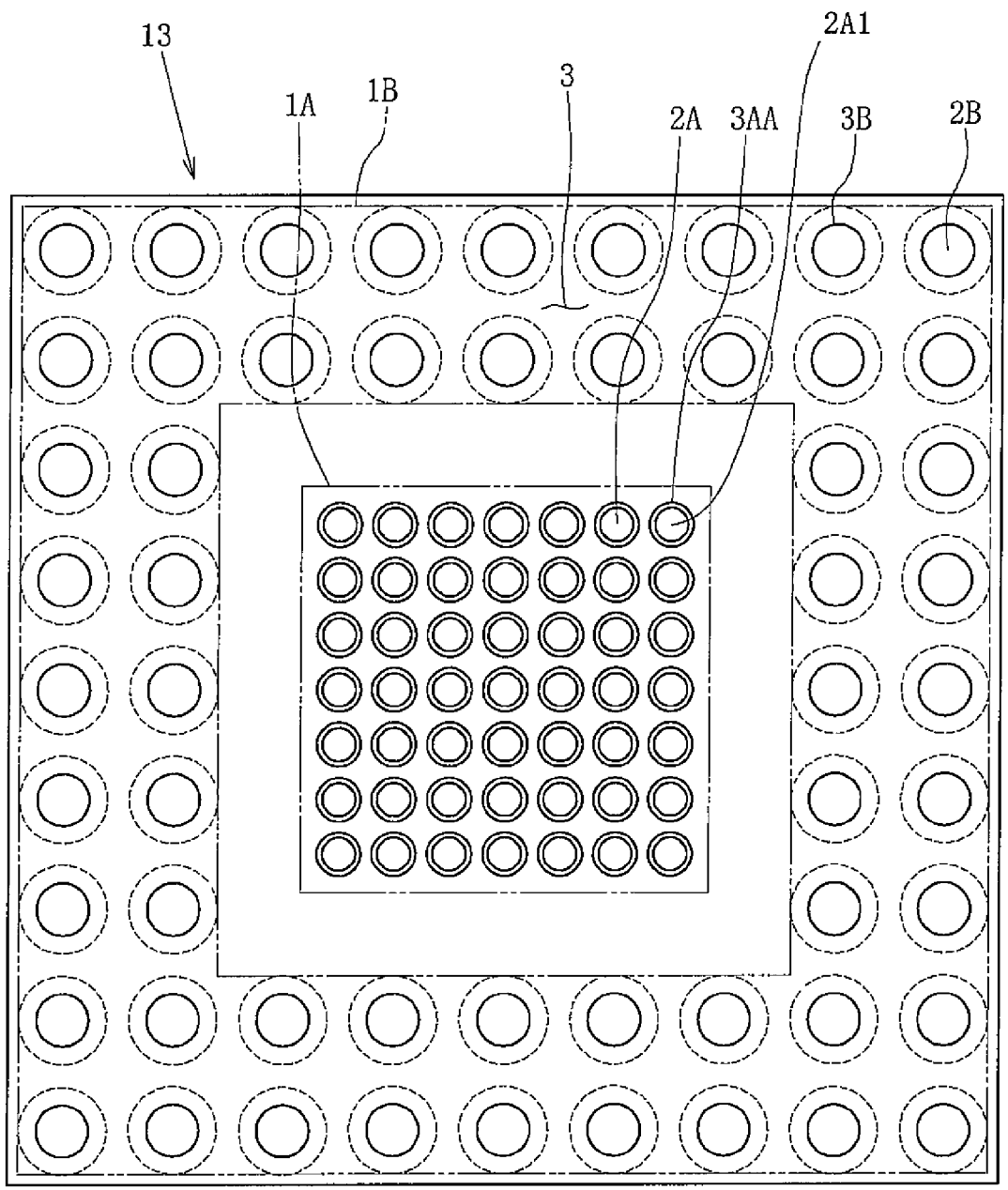
FIG. 16 is a plan view showing the wiring board shown in FIG. 15.

Alternatively, the structure of the wiring board 10 may be changed into, for example, the structure of a wiring board 13 shown in FIGS. 15 and 16. That is, though the foregoing preferred embodiment has illustrated the case where the solder resist 3 on the upper surface side is provided with the concave part 3A, the bottom surface of which is the entire area corresponding to the semiconductor element mounting portion 1A, and the side wall surrounds the semiconductor element mounting portion 1A. On the other hand, as shown in FIGS. 15 and 16, concave parts 3AA for individually exposing the individual semiconductor element connection pads 2A may be disposed. Consequently, all the upper surfaces 2A1 of the semiconductor element connection pads 2A are exposed onto the bottom surfaces of the concave parts 3AA, respectively.

In the above case, when the electrode terminals of the semiconductor integrated circuit element E1 are connected to the semiconductor element connection pads 2A through the conductive bumps B1, the concave parts 3AA can be used as guides for positioning the conductor bumps B1 and the semiconductor element connection pads 2A. This facilitates mounting of the semiconductor integrated circuit element E1 onto the wiring board 13. Otherwise, the structure is identical to that of the wiring board 10 described above.

<Second Preferred Embodiment>

Figure 17:
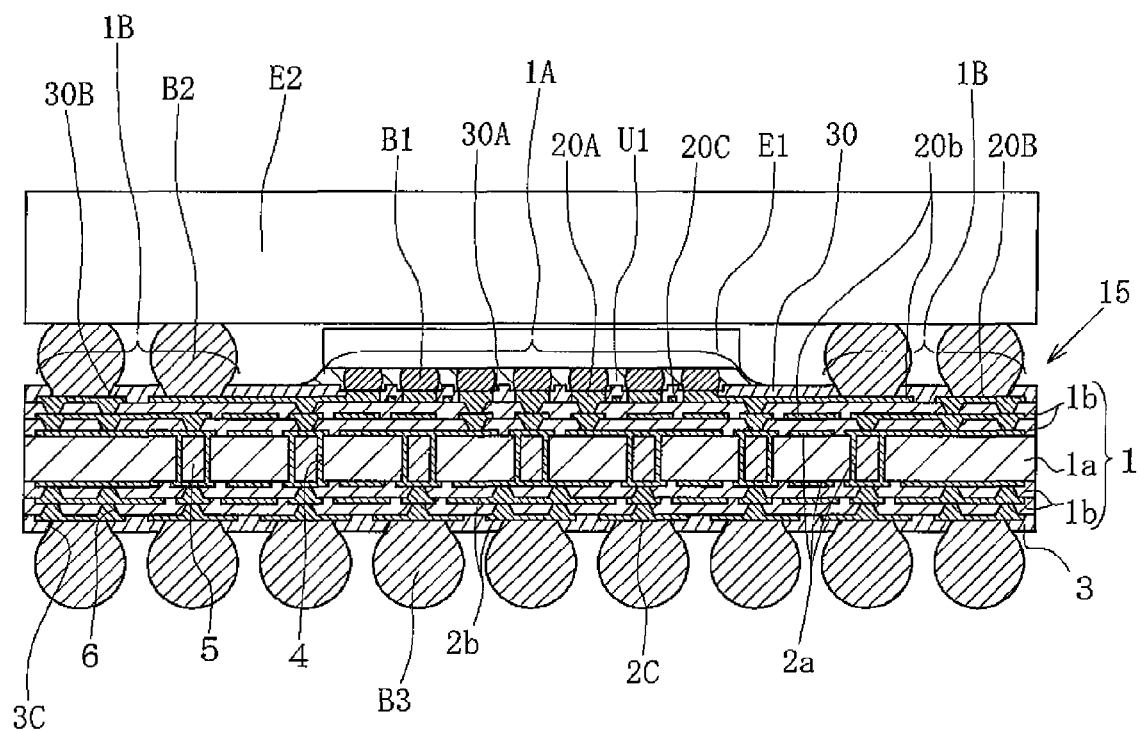
FIG. 17 is a schematic sectional view showing a wiring board according to a second preferred embodiment of the invention.
Figure 18:
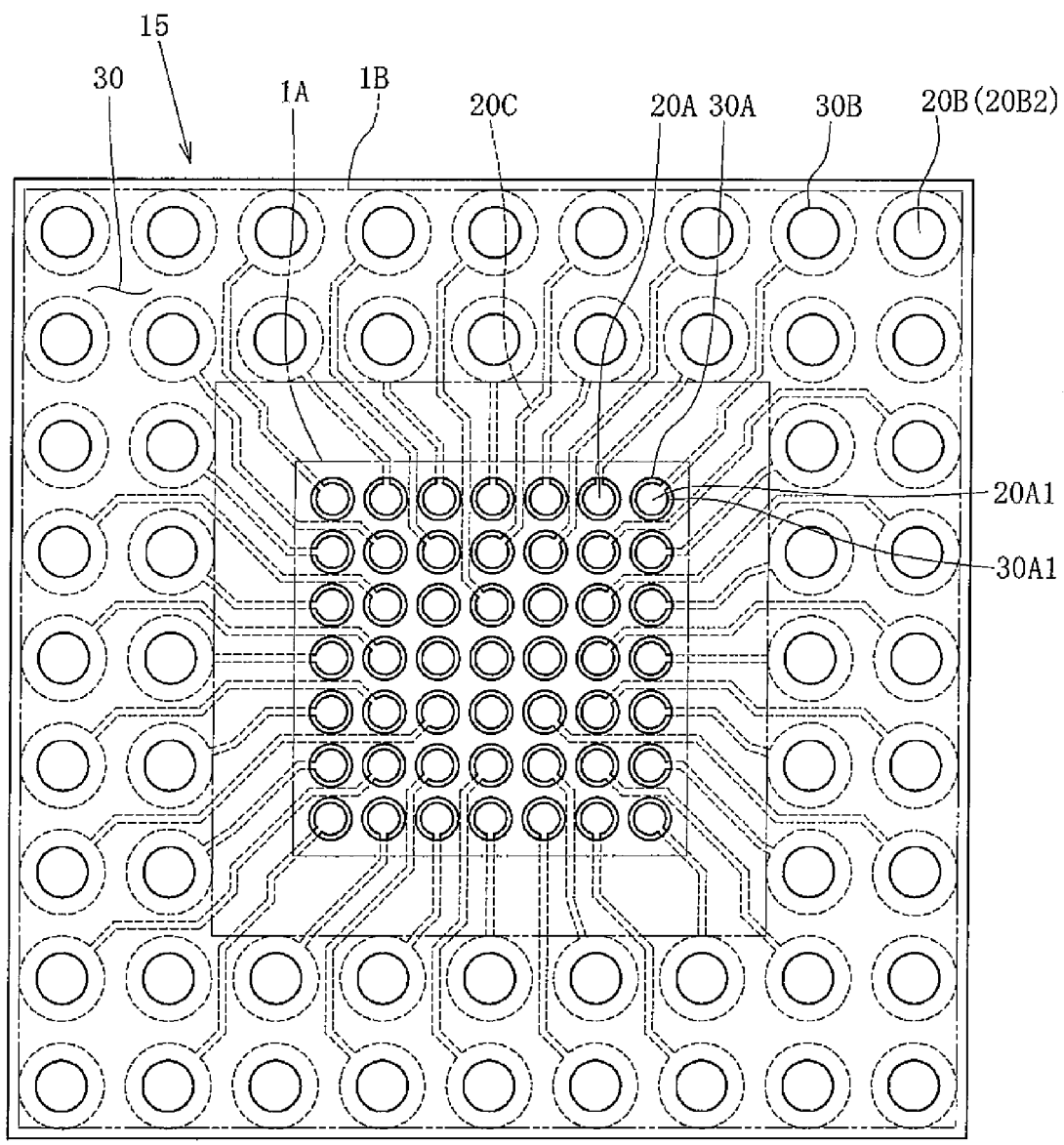
FIG. 18 is a plan view of the wiring board shown in FIG. 17.
Figure 19:
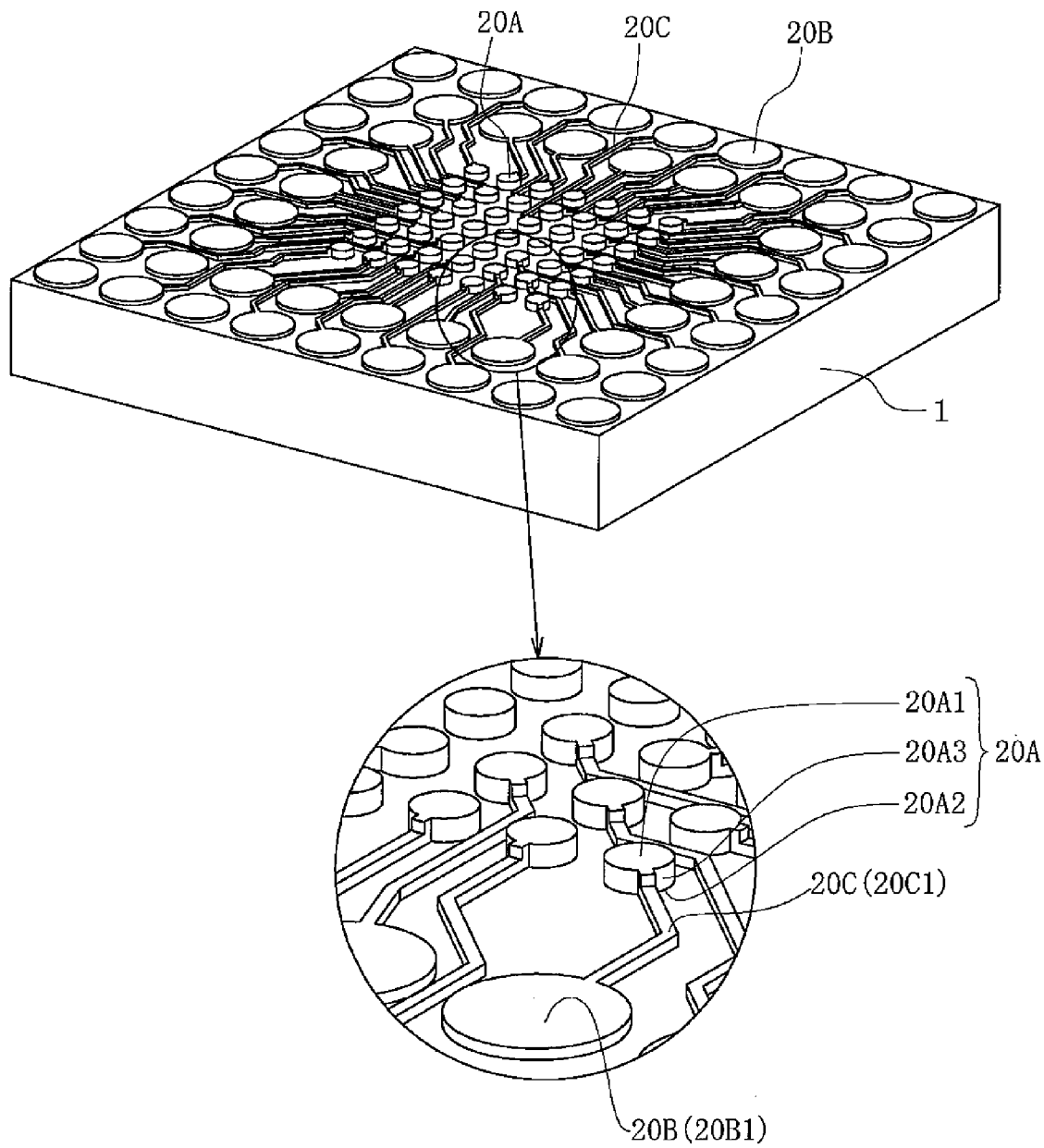
FIG. 19 is a perspective view of important parts in the wiring board shown in FIG. 17.
Figure 20:
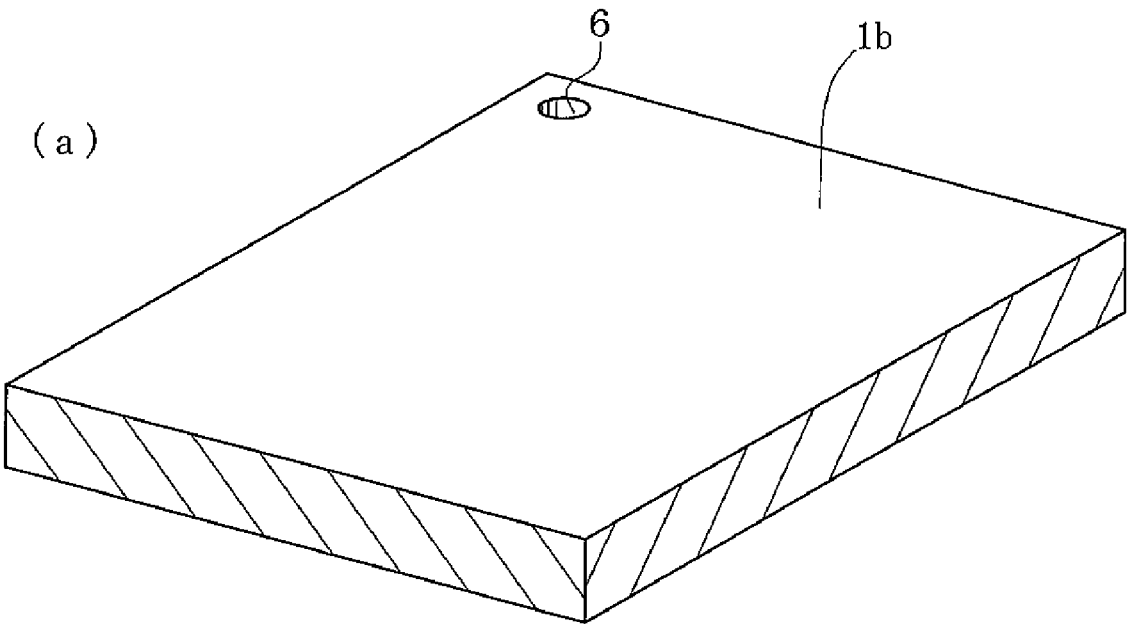
FIGS. 20(a) and 20(b) are schematic explanatory drawings showing a method of manufacturing the wiring board of the second preferred embodiment.
Figure 20:
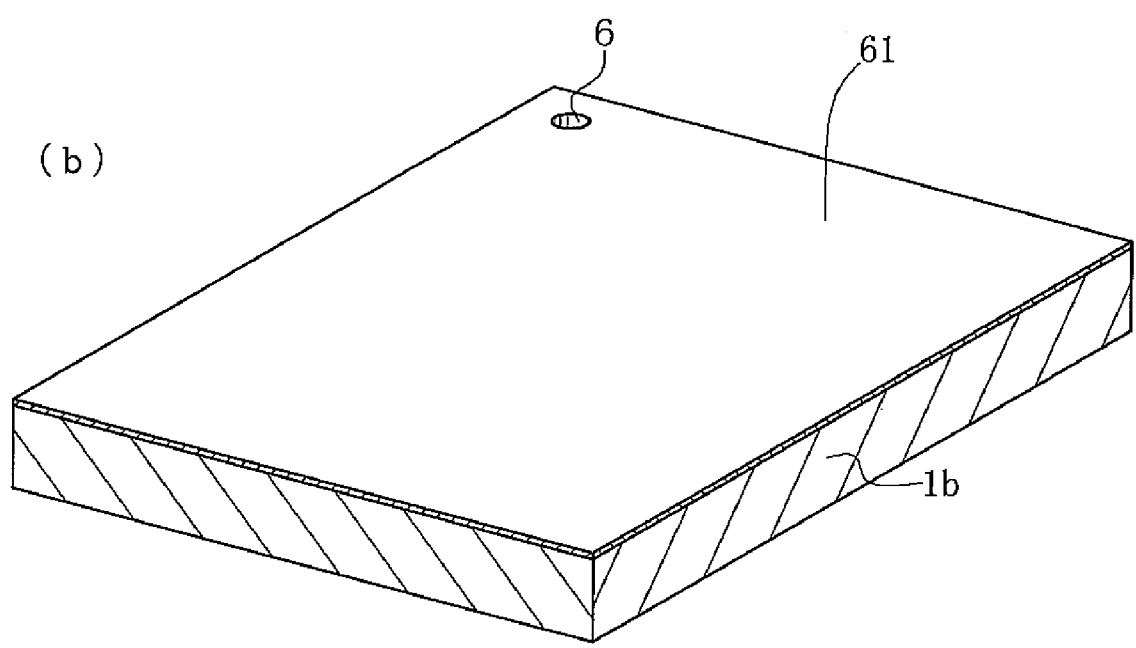
Figure 21:
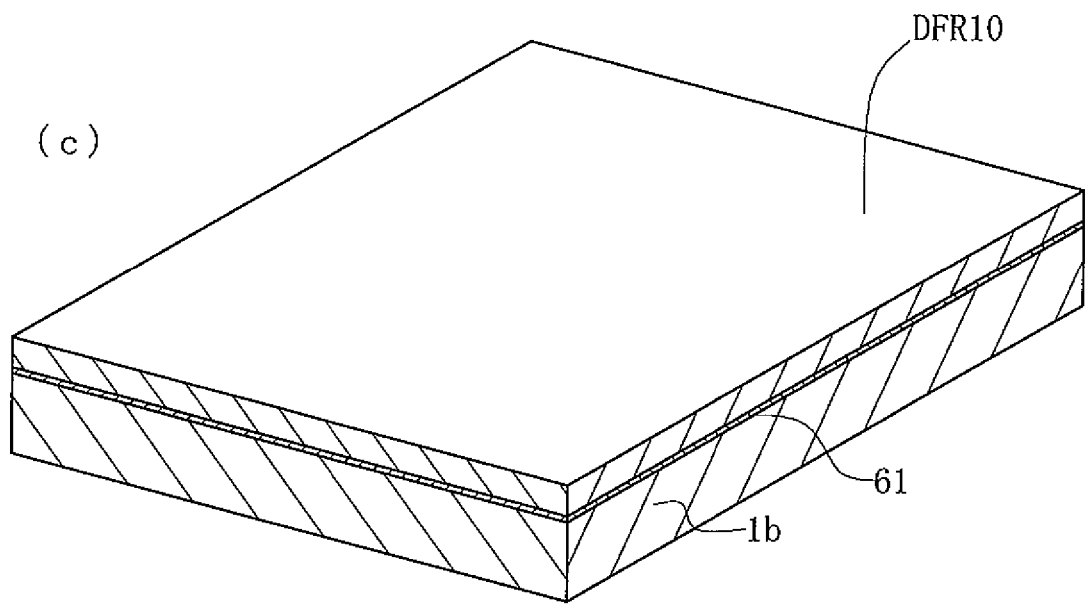
FIGS. 21(c) and 21(d) are schematic explanatory drawings showing the method of manufacturing the wiring board of the second preferred embodiment.
Figure 21:
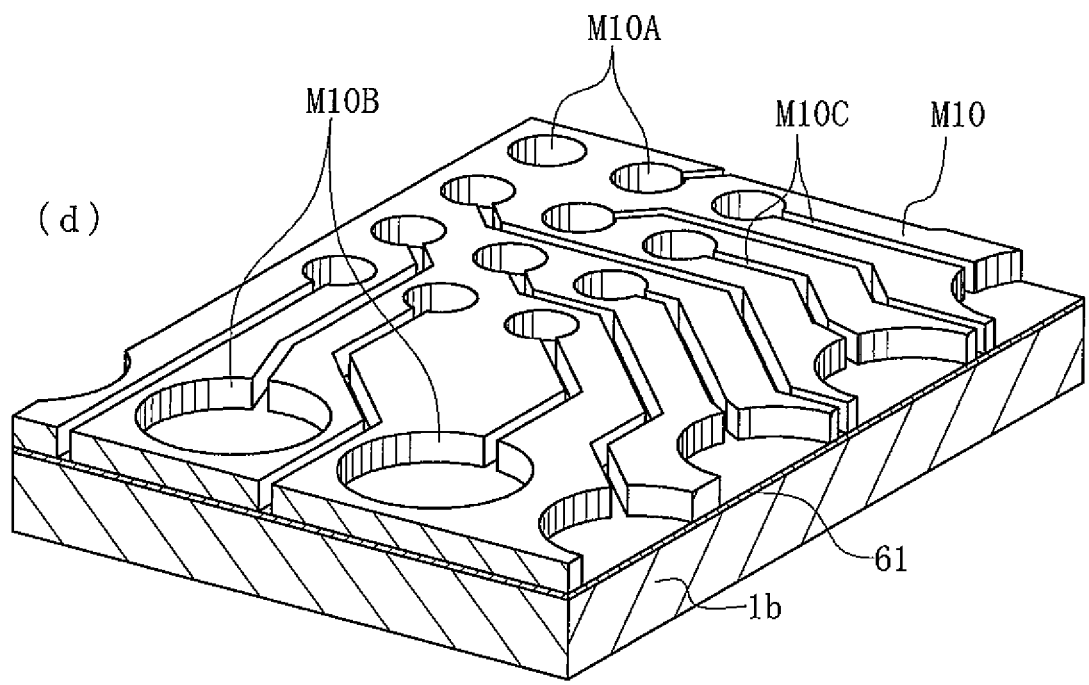

A second preferred embodiment of the invention will be described with reference to FIGS. 17 to 19. In FIGS. 17 to 19, similar reference numerals have been used to denote parts having the same structure as those in FIGS. 1 to 16, and their descriptions are omitted.

As shown in FIGS. 17 and 18, a solder resist layer 30 is deposited onto the outermost surface of an insulation substrate 1 on the upper surface side of a wiring board 15 according to the present preferred embodiment. A build-up wiring conductor 20*b* is deposited onto the inside and the surface of the insulation substrate 1 on the upper surface side of the wiring board 15.

A part of the wiring conductor 20*b* which is deposited onto the outermost insulation layer 1*b* on the upper surface side of the wiring board 15 forms semiconductor element connection pads 20A. The semiconductor element connection pads 20A are circular pads electrically connected through conductive bumps B1 to the electrode terminals of a semiconductor integrated circuit element E1 in a semiconductor element mounting portion 1A. A plurality of the semiconductor element connection pads 20A are arranged in a lattice form.

Another part of the wiring conductor 20*b* which is deposited onto the outermost insulation layer 1*b* on the upper surface side of the wiring board 15 forms electronic component pads 20B. The electronic component connection pads 20B are circular pads electrically connected by solder ball connection through solder balls B2 to the electrode terminals of the semiconductor element mounting substrate E2 in the electronic component mounting portion 1B. This achieves high-density mounting of semiconductor elements of narrow pitch electrode and other electronic components onto the wiring board. A plurality of the electronic component connection pads 20B are arranged side by side.

Yet another part of the wiring conductor 20*b* which is deposited onto the outermost insulation layer 1*b* on the upper surface side of the wiring board 15 forms strip-shaped wiring conductors 20C. The strip-shaped wiring conductors 20C extend in a band-shape from the semiconductor element mounting portion 1A to the electronic component mounting portion 1B. A plurality of the electronic component connection pads 20B are arranged side by side. A certain number of the semiconductor element connection pads 20A and a certain number of the electronic component connection pads 20B are electrically connected to each other through the strip-shaped wiring conductors 20C.

More specifically, the dimension from the upper surface 20A1 to the lower surface 20A2 of each of the semiconductor element connection pads 20A is identical, as shown in FIG. 19 which is a top perspective view, with the solder resist layer 30 on the upper surface side omitted. That is, the shape of the semiconductor element connection pads 20A is a substantially cylinder. All the upper surfaces 20A1 of the semiconductor element connection pads 20A are exposed from the solder resist layer 30 on the upper surface side. Hence, even if the arrangement pitch of the semiconductor element connection pads 20A is a narrow pitch of less than 150 µm, a wide space between the adjacent semiconductor element connection pads 20A and 20A is ensured on the upper surfaces 20A1 of the semiconductor element connection pads 20A, while ensuring a sufficient area to be connected with the electrode terminals of the semiconductor integrated circuit element E1. The strip-shaped wiring conductor 20C can be formed between the adjacent semiconductor element connection pads 20A and 20A, while keeping a sufficient distance between the adjacent semiconductor element connection pads 20A and 20A.

The upper surfaces 20A1 of the semiconductor element connection pads 20A protrude approximately 5 to 15 µm above the upper surfaces 20C1 of the strip-shaped wiring conductors 20C and the upper surfaces 20B1 of the electronic component connection pads 20B. With this arrangement, the strip-shaped wiring conductors 20C can be covered with a solder resist layer 30, while exposing all the upper surfaces 20A1 of the semiconductor element connection pads 2A. Although the arrangement pitch of the semiconductor element connection pads 20A is a narrow pitch of less than 150 µm, the strip-shaped wiring conductor 20C covered with the solder resist layer 30 can be formed between the adjacent semiconductor element connection pads 20A and 20A, thereby providing the wiring board having a high degree of freedom of design.

The semiconductor element connection pads 20A have a thickness of approximately 10 to 30 µm. The arrangement pitch of these semiconductor element connection pads 20A is a narrow pitch of less than 150 µm, preferably 120 to 140 µm.

The diameter of the semiconductor element connection pads 20A are set so that the strip-shaped wiring conductors 20C having a width of approximately 15 µm can be formed between the adjacent semiconductor element connection pads 20A and 20A, while keeping a distance of approximately 15 µm between the adjacent semiconductor element connection pads 20A. The followings are specific examples of the diameter of the semiconductor element connection pads 20A. The diameter is set to not more than 85 µm when the arrangement pitch is 140 µm. The diameter is set to not more than 75 µm when the arrangement pitch is 130 µm. The diameter is set to not more than 65 µm when the arrangement pitch is 120 µm.

The electronic component connection pads 20B have a thickness of approximately 10 to 15 µm, and a diameter of approximately 200 to 450 µm. The electronic component connection pads 20B are formed on the upper surface outer peripheral part of the insulation substrate 1 into a frame-shape surrounding the semiconductor element connection pads 20A at an arrangement pitch of 400 to 650 µm.

The strip-shaped wiring conductor 20C is in a band-shape whose thickness is approximately 10 to 15 µm identical to that of the electronic component connection pads 20B, and width is approximately 10 to 15 µm. The strip-shaped wiring conductors 20 extend from the semiconductor element connection pads 20A lying on the outermost periphery and from the semiconductor element connection pads 20A lying inside than those toward the outside of the semiconductor element mounting portion 1A. With this arrangement, a large number of the semiconductor element connection pads 20A and the electronic component connection pads 20B can be directly electrically connected to each other on the outermost insulation layer 1*b*. Accordingly, the wiring board 15 enhances the degree of freedom of design of the wiring board.

The strip-shaped wiring conductors 20C extending from the semiconductor connection pads 20A lying inside are formed to extend between the semiconductor element connection pads 20A and 20A lying outside than those, while keeping a distance of not less than 15 µm between these semiconductor element connection pads 20A.

On the other hand, the solder resist layer 30 on the upper surface side is deposited to cover the strip-shaped wiring conductors 20C and expose all the upper surfaces 20A1 of the semiconductor element connection pads 20A and the upper surface mid parts 20B2 of the electronic component connection pads 20B.

The solder resist layer 30 has circular concave parts 30A whose bottom surface corresponds to the upper surfaces 20A1 of the semiconductor element connection pads 20A and their surroundings 30A1. The semiconductor element connection pads 20A are individually exposed at a mid part of the bottom surface (refer to FIG. 27(p)). Consequently, all the upper surfaces 20A1 of the individual semiconductor element connection pads 20A are exposed from the solder resist layer 30, and the side surfaces 20A3 thereof adhere to the solder resist layer 30 (refer to FIG. 19).

These concave parts 30A can be used as guides for positioning the conductive bumps B1 and the semiconductor element connection pads 20A when the electrode terminals of the semiconductor integrated circuit element E1 are connected to the semiconductor element connection pads 20A through the conductive bumps B1. This facilitates mounting of the semiconductor integrated circuit element E1 onto the wiring board 15.

The diameter of these concave parts 30A is preferably larger than the diameter of the semiconductor element connection pads 20A by not less than 15 μm. If this requirement is not satisfied, it might be difficult to satisfactorily expose the entire upper surfaces 20A1 of the semiconductor element connection pads 20A within the concave parts 30A.

The depth of these concave parts 30A is preferably approximately 2 to 10 μm. If the depth of these concave parts 30A is less than 2 μm, it might be difficult to perform positioning between the conductive bumps B1 and the semiconductor element connection pads 20A by using these concave parts 30A. If it exceeds 10 μm, the strip-shaped wiring conductor 20C lying between the adjacent semiconductor element connection pads 20A and 20A is highly likely to be exposed from the solder resist layer 30, making it difficult to ensure electrical insulating properties in the uppermost wiring conductor 20b.

In cases where the arrangement pitch of the semiconductor element connection pads 20A becomes extremely narrow and it is difficult to dispose the concave parts 30A for individually surrounding the semiconductor element connection pads 20A in the solder resist layer 30, the upper surfaces 20A1 of the semiconductor element connection pads 20A are preferably exposed by disposing a concave part 30AA for collectively surrounding the semiconductor element mounting portion 1A as described later.

The solder resist layer 30 has circular openings 30B for exposing the upper surface mid parts 20B2 of the electronic component connection pads 20B. Therefore, the outer peripheral parts of the electronic component connection pads 20B are covered with the solder resist layer 30, and the upper surface mid parts 20B2 of the electronic component connection pads 20B are exposed from the solder resist layer 30.

The upper surface mid parts 20B2 of the electronic component connection pads 20B are exposed within the openings 30B disposed in the solder resist layer 30, and form the bottom surfaces of the concave parts formed with the openings 30B, respectively. With this arrangement, when the semiconductor element mounting substrate E2 is mounted onto the wiring board 15, the solder balls B2 for connecting the electrode terminals of the semiconductor element mounting substrate E2 and the electronic component connection pads 20B can be satisfactorily positioned on the electronic component connection pads 20B, thereby satisfactorily mounting the semiconductor element mounting substrate E2 onto the wiring board 15.

The area array type semiconductor integrated circuit element E1 is mounted onto the wiring board 15 by electrically connecting the electrode terminals of the semiconductor integrated circuit element E1 (less than 150 μm pitch) and the semiconductor element connection pads 20A to each other through the conductive bumps B1 (flip-chip connection), and by filling the filling resin U1 into the space between the semiconductor integrated circuit element E1 and the wiring board 15.

At this time, the upper surfaces 20A1 of the semiconductor element connection pads 20A protrude above the upper surfaces 20C1 of the strip-shaped wiring conductors 20C. This ensures a sufficient distance in a height direction between the semiconductor integrated circuit element E1 and the wiring board 15, thereby providing the wiring board having excellent filling performance of the filling resin U1.

Subsequently, the semiconductor element mounting substrate E2 is further mounted onto the wiring board 15 by electrically connecting the electrode terminals of the semiconductor element mounting substrate E2 as an electronic component and the electronic component connection pads 20B to each other through the solder balls B2 (solder ball connection). This achieves high-density mounting of semiconductor elements and electronic components onto the wiring board 15. Otherwise, the structure is identical to that of the wiring board 10 according to the first preferred embodiment, and therefore the descriptions thereof are omitted here.

Next, the method of manufacturing the wiring board 15 will be described below in detail with reference to FIGS. 20 to 27, by illustrating the formations of the semiconductor element connection pads 20A, the electronic component connection pads 20B and the solder resist layer 30.

As shown in FIG. 20(a), similarly to the first preferred embodiment, a via hole 6 is formed in the outermost insulation layer 1b on the upper surface side. Then, as shown in FIG. 20(b), a base plating layer 61 for electrolytic plating is deposited by electroless copper plating over the surface of the insulation layer 1b and the entire surface within the via hole 6. The electroless plating for forming the base plating layer 61 is preferably electroless copper plating.

As shown in FIG. 21(c), a first alkaline-developable photosensitive dry film resist DFR10 is stuck onto the surface of the base plating layer 61, and the DFR10 is then exposed and developed into a predetermined pattern using photolithography techniques. As shown in FIG. 21(d), this results in the formation of a first plating mask M10 having a plurality of openings M10A for forming semiconductor element connection pads which have shapes corresponding to the semiconductor element connection pads 20A, a plurality of openings M10B for forming electronic component connection pads which have a shape corresponding to the electronic component connection pads 20B, and a plurality of openings M10C for forming strip-shaped wiring conductors which have a shape corresponding to the strip-shaped wiring conductor 20C. Preferably, the thickness of the first plating mask M10 is slightly larger than the thickness of the semiconductor element connection pads 20A to be formed later.

As shown in FIG. 22(e), a first plating layer 62 having a shape corresponding to the semiconductor element connection pads 20A and the electronic component connection pads 20B and band-shaped wiring conductor 20C is deposited by electrolytic plating method on the base plating layer 61 exposed within the openings M10A for forming semiconductor element connection pads and the openings M10B for forming electronic component connection pads and the openings M10C for strip-shaped wiring conductors in the first plating mask M10.

The electrolytic plating for forming the first plating layer 62 is preferably electrolytic copper plating. The plating layer 62 is preferably thinner than the first plating mask M10. Specifically, the thickness of the plating layer 62 is 8 to 20 μm, preferably 10 to 15 μm.

Figure 22:
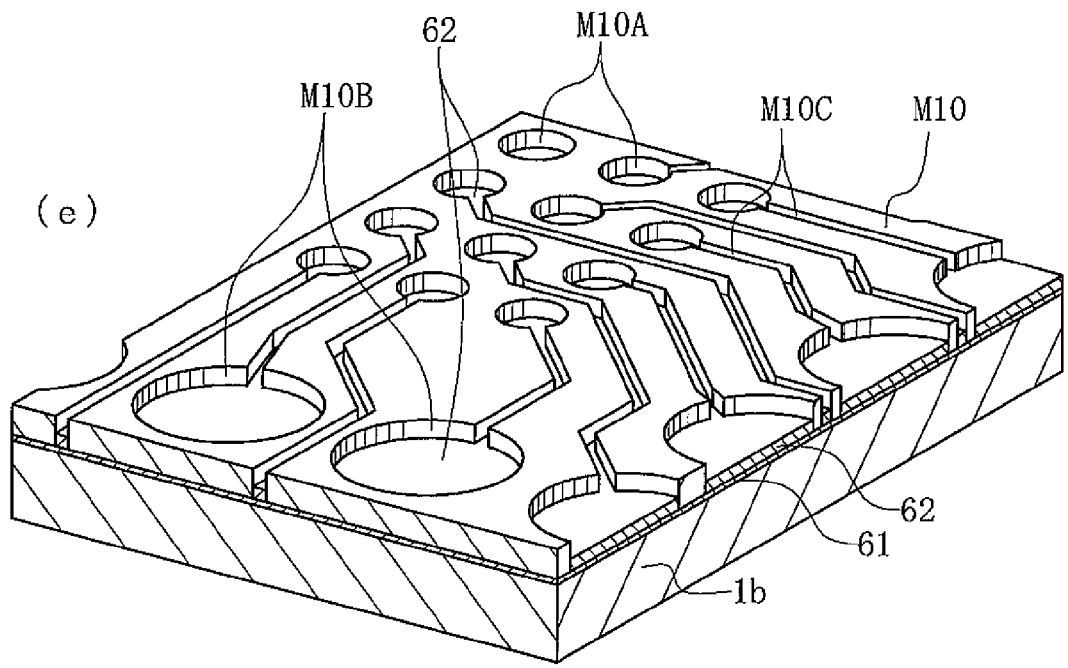
FIGS. 22(e) and 22(f) are schematic explanatory drawings showing the method of manufacturing the wiring board of the second preferred embodiment.
Figure 22:
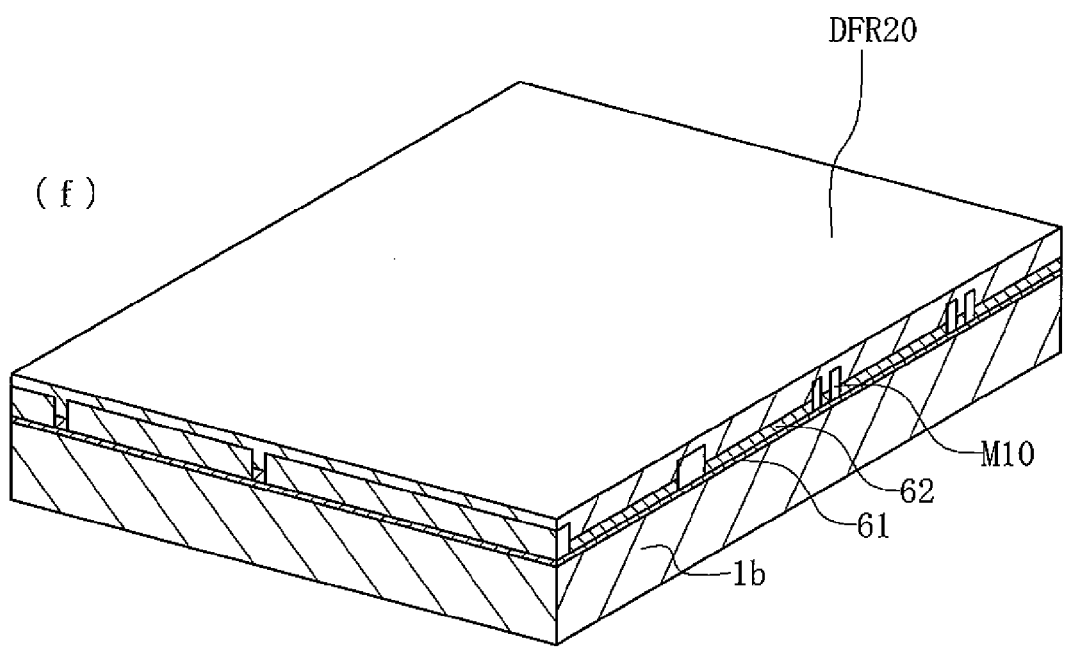
Figure 23:
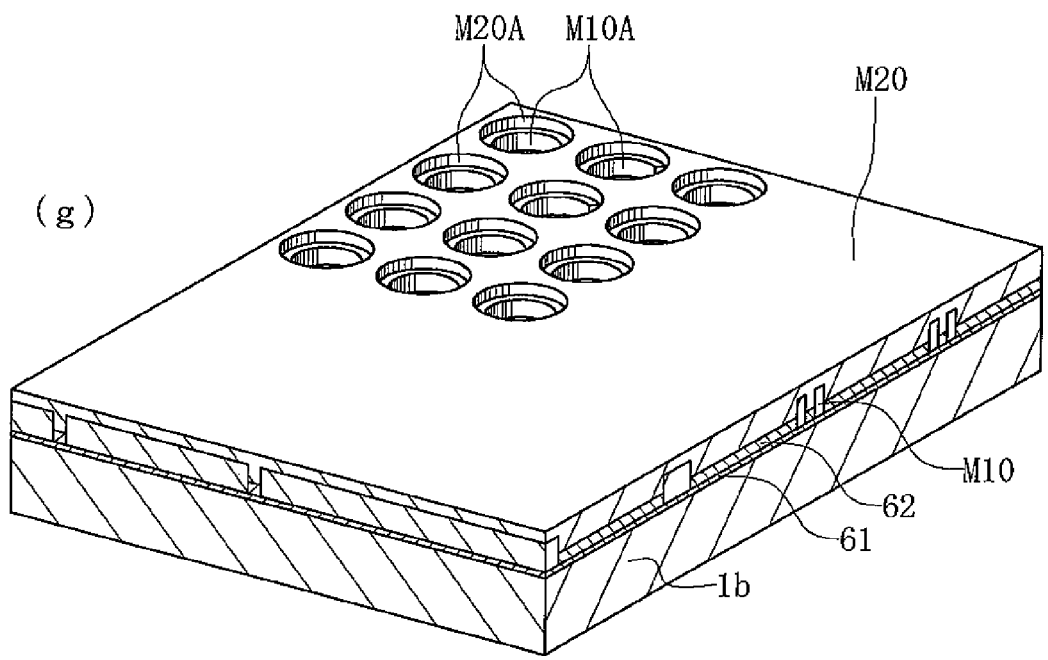
FIGS. 23(g) and 23(h) are schematic explanatory drawings showing the method of manufacturing the wiring board of the second preferred embodiment.
Figure 23:
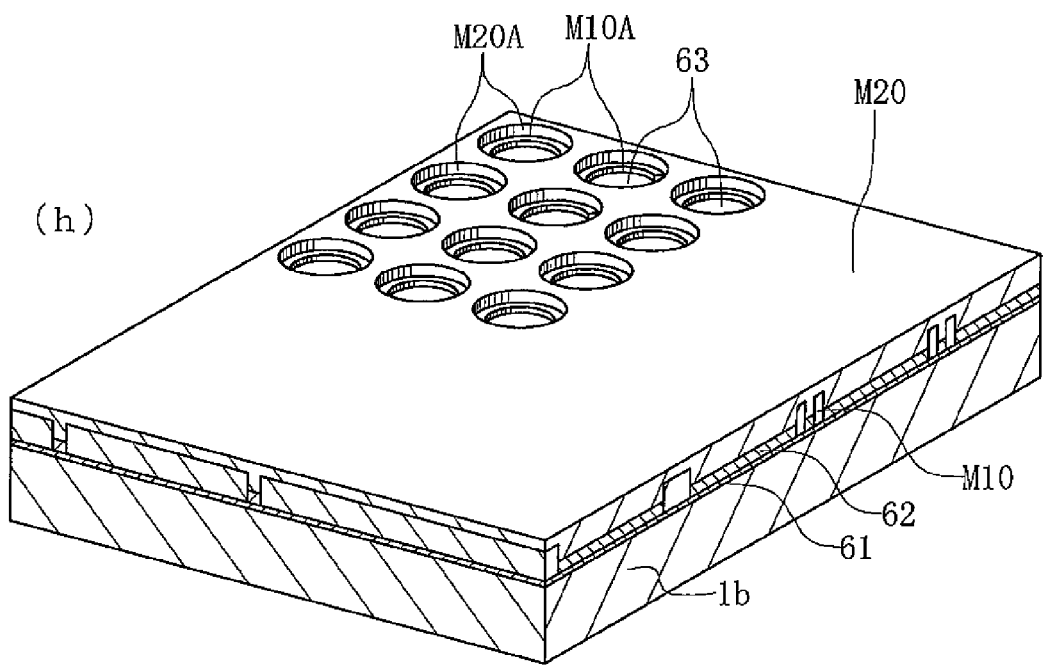

As shown in FIG. 22(*f*), a second alkaline-developable photosensitive dry film resist DFR20 is stuck onto the surfaces of the first plating mask M10 and the first plating layer 62, and the DFR20 is then exposed and developed into a predetermined pattern using photolithography techniques. As shown in FIG. 23(*g*), this results in the formation of a second plating mask M20 having a plurality of openings M20A for exposing the openings M10A for forming the semiconductor element connection pads, and covering the openings M10B for forming electronic component connection pads and the openings M10C for forming strip-shaped wiring conductors.

The diameter of the openings M20A of the second plating mask M20 is preferably larger than the diameter of the openings M10A for forming semiconductor element connection pads of the first plating mask M10 by approximately 15 to 25 μm. The thickness thereof on the first plating mask M10 is preferably not less than 5 μm.

As shown in FIG. 23(*h*), a second plating layer 63 is deposited by electrolytic plating on the first plating layer 62 within the openings 10A for forming semiconductor element connection pads which are exposed from the second plating mask M20.

The second plating layer 63 is preferably formed by electrolytic copper plating. The height of the second plating layer 63 is slightly lower than the upper surface of the first plating mask M10. At this time, in the first plating layer 62 and the second plating layer 63 formed within the same openings 10A for forming semiconductor element connection pads, their respective side surfaces are not shifted from each other, and the dimension from the upper surface to the lower surface of each of the semiconductor element connection pads is identical.

Figure 24:
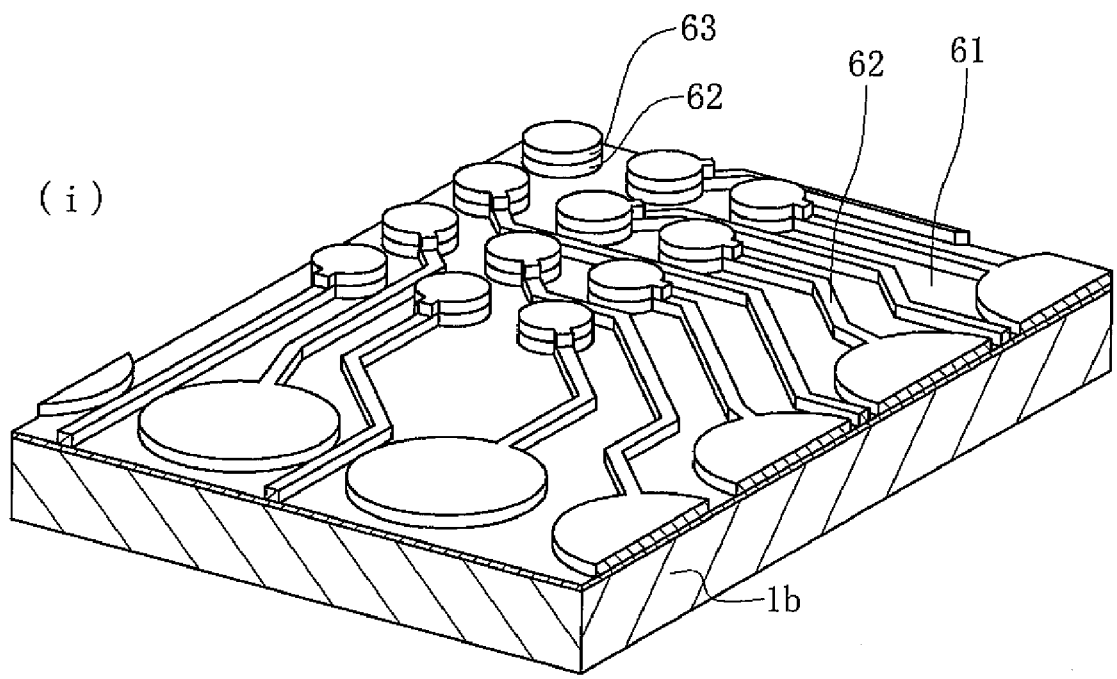
FIGS. 24(i) and 24(j) are schematic explanatory drawings showing the method of manufacturing the wiring board of the second preferred embodiment.
Figure 24:
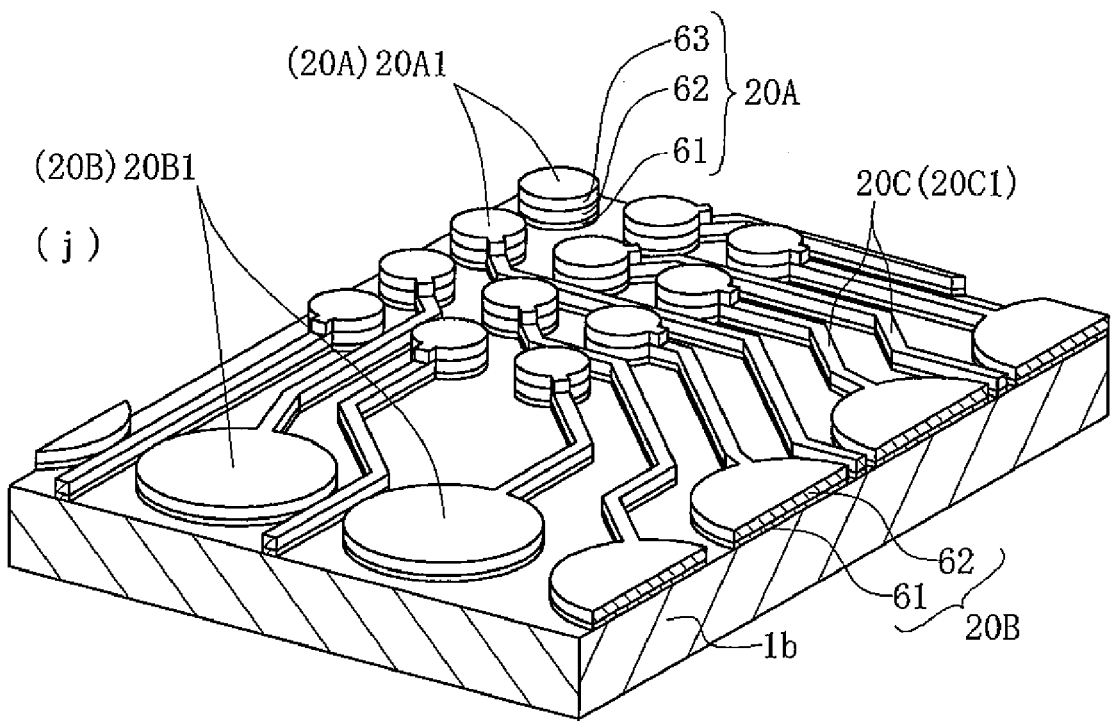

As shown in FIG. 24(*i*), the first plating mask M10 and the second plating mask M20 are then removed. The first plating mask M10 and the second plating mask M20 can be removed by means of immersion into an alkaline solution such as a sodium hydrate solution.

As shown in FIG. 24(*j*), the base plating layer 61 except for the area covered with the first plating layer 62 is removed. This results in the formation of the semiconductor element connection pads 20A made up of the base plating layer 61 and the first plating layer 62 and the second plating layer 63, and the electronic component connection pads 20B and the strip-shaped wiring conductors 20C made up of the base plating layer 61 and the first plating layer 62.

At this time, the upper surfaces 20A1 of the semiconductor element connection pads 20A protrude above the upper surfaces 20B1 of the electronic component connection pads 20B and the upper surfaces 20C1 of the strip-shaped wiring conductors 20C by the thickness of the second plating layer 63. This ensures a sufficient distance in a height direction between the semiconductor integrated circuit element E1 and the wiring board 15, thus enhancing the filling performance of the filling resin U1.

In order to remove the base plating layer 61 except for the area covered with the first plating layer 62, the base plating layer 61 exposed by removing the first plating mask M10 and the second plating mask M20 may be etched away using etchant containing aqueous hydrogen peroxide, sodium persulfate, or the like.

Figure 25:
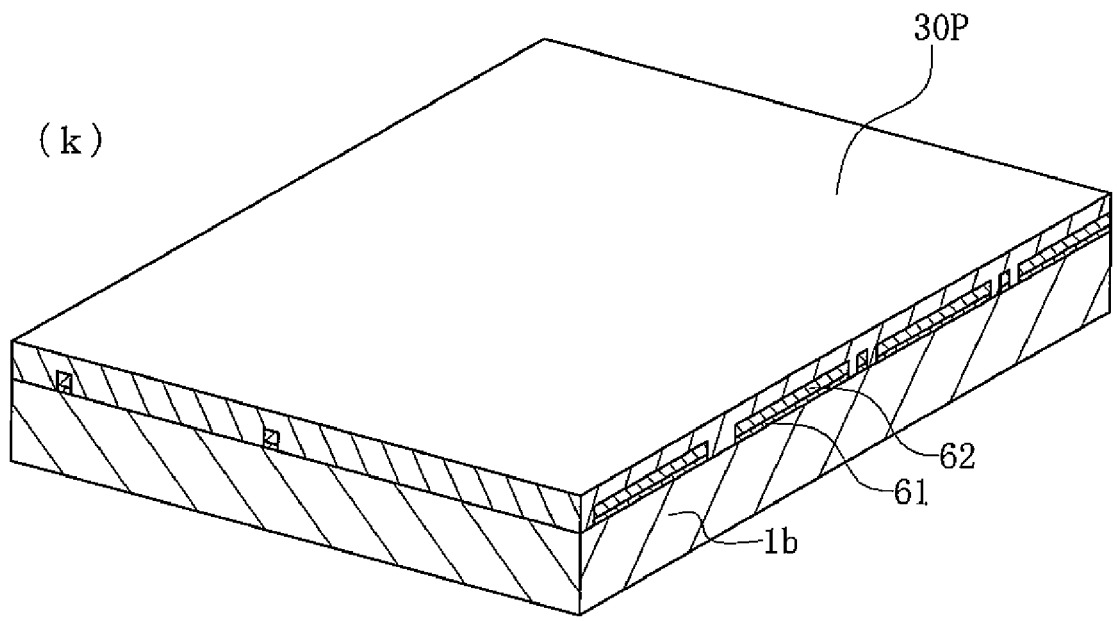
FIGS. 25(k) and 25(l) are schematic explanatory drawings showing the method of manufacturing the wiring board of the second preferred embodiment.
Figure 25:
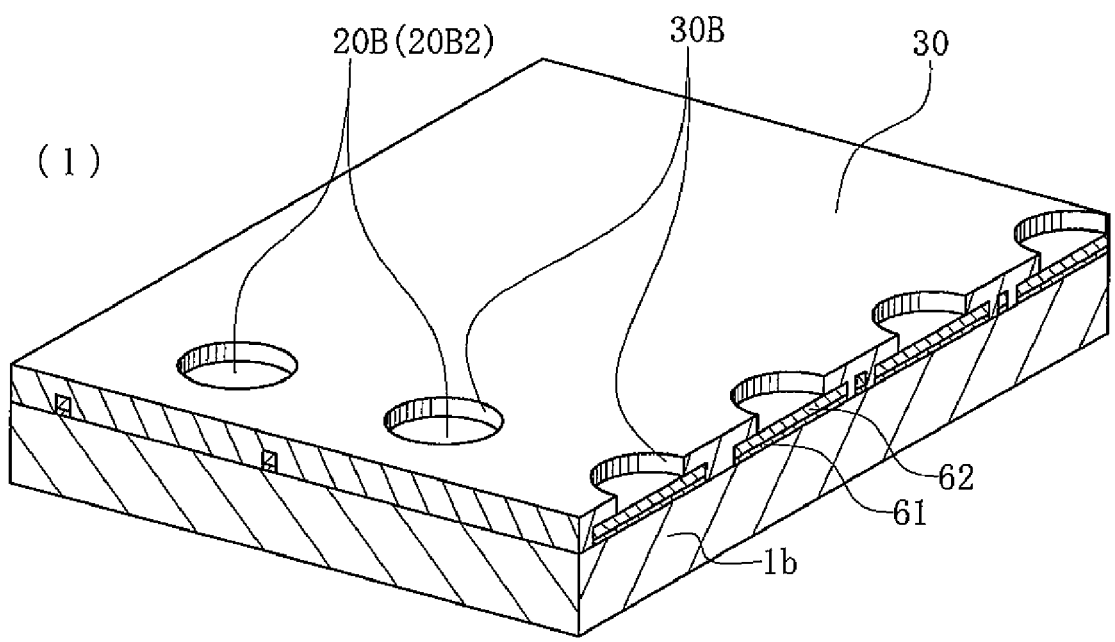

As shown in FIG. 25(*k*), a resin layer 30P for a solder resist layer covering the semiconductor element connection pads 20A and the electronic component connection pads 20B is deposited over the entire surface of the outermost insulation layer 1*b* on the upper surface side. Examples of the resin constituting the resin layer 30P includes the same resins as described in the wiring board 10 of the foregoing first preferred embodiment. The deposited resin layer 302 is exposed and developed into a predetermined pattern using photolithography techniques. As shown in FIG. 25(*l*), this results in the formation of a solder resist layer 30 having openings 30B for exposing the upper surface mid parts 20B2 of the electronic component connection pads 20B.

Figure 26:
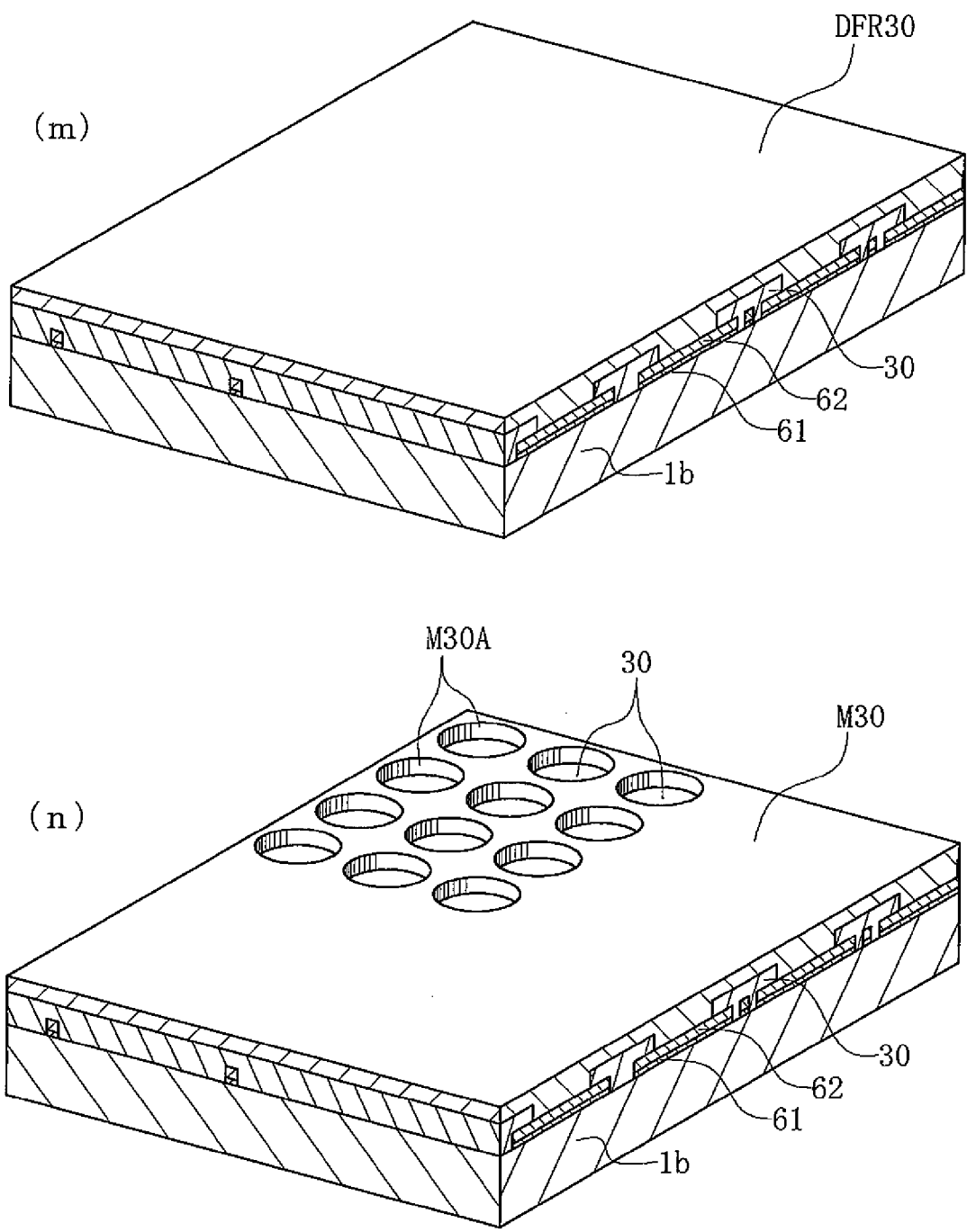
FIGS. 26(m) and 26(n) are schematic explanatory drawings showing the method of manufacturing the wiring board of the second preferred embodiment.

As shown in FIG. 26(*m*), a third alkaline-developable photosensitive dry film resist DFR30 covering the openings 30B is stuck onto the entire surface of the solder resist layer 30, and the DFR 30 is then exposed and developed into a predetermined pattern using photolithography techniques. As shown in FIG. 26(*n*), this results in the formation of a ablation mask M30 having openings M30A for exposing the area corresponding to the semiconductor element connection pads 20A and the surroundings thereof on the upper surface of the solder resist layer 30.

The diameter of the openings M30A of the ablation mask M30 is preferably larger than the diameter of the semiconductor element connection pads 20A by approximately 20 to 50 μm. The thickness thereof on the solder resist layer 30 is preferably not less than 15 μm.

Figure 27:
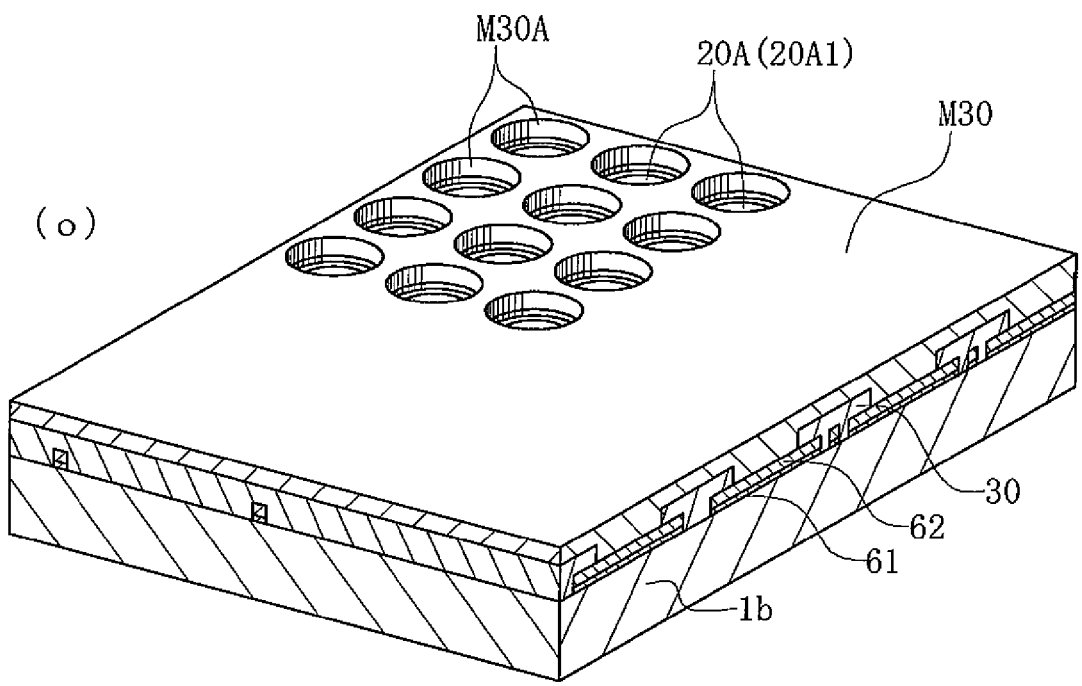
FIGS. 27(o) and 27(p) are schematic explanatory drawings showing the method of manufacturing the wiring board of the second preferred embodiment.
Figure 27:
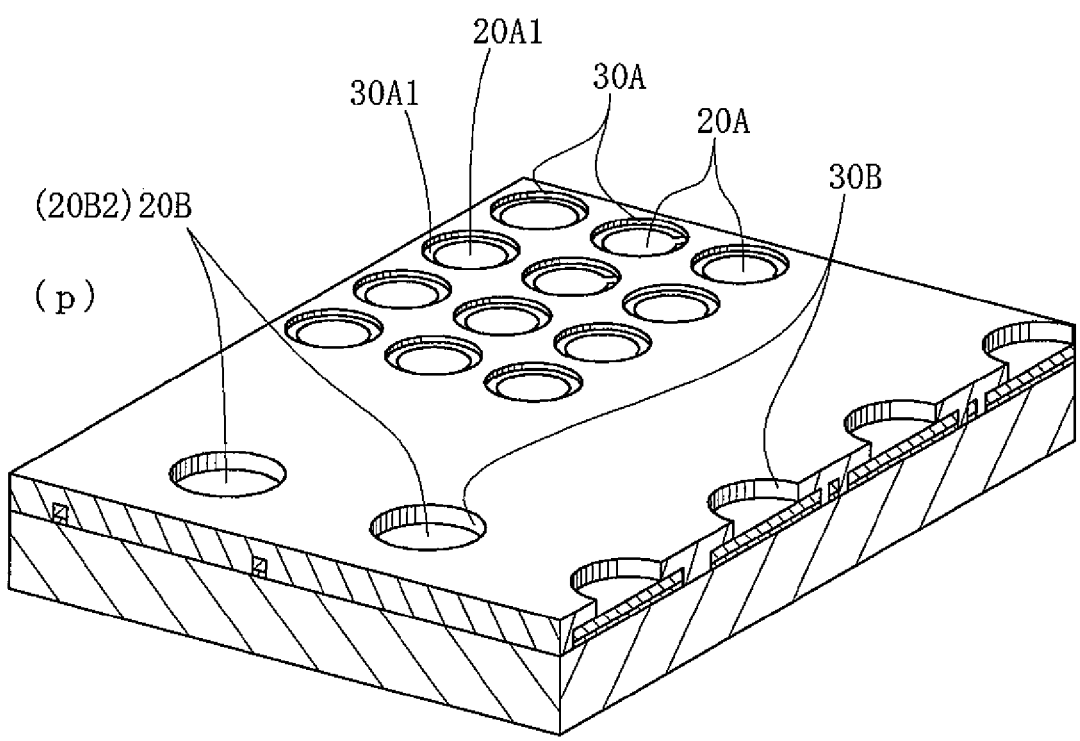

As shown in FIG. 27(*o*), the solder resist layer 30 exposed from the openings M30A of the ablation mask M30 is then ablated until all the upper surfaces 21A1 of the semiconductor element connection pads 20A are exposed. The ablation may be carried out by employing any one of various kinds of known mechanical ablation methods including wet blasting method, and laser scribing method.

The ablation mask M30 is then removed. For example, the ablation mask M30 can be removed by means of immersion into an alkaline solution such as a sodium hydrate solution. The ablation mask M30 is thus removed to thereby complete the wiring board 15 in which all the upper surfaces 21A1 of the semiconductor element connection pads 20A are exposed within the concave parts 30A formed in the solder resist layer 30, and the upper surface mid parts 20B2 of the electronic component connection pads 20B are exposed within the openings 30B formed in the solder resist layer 30, as shown in FIG. 27(*p*).

Figure 28:
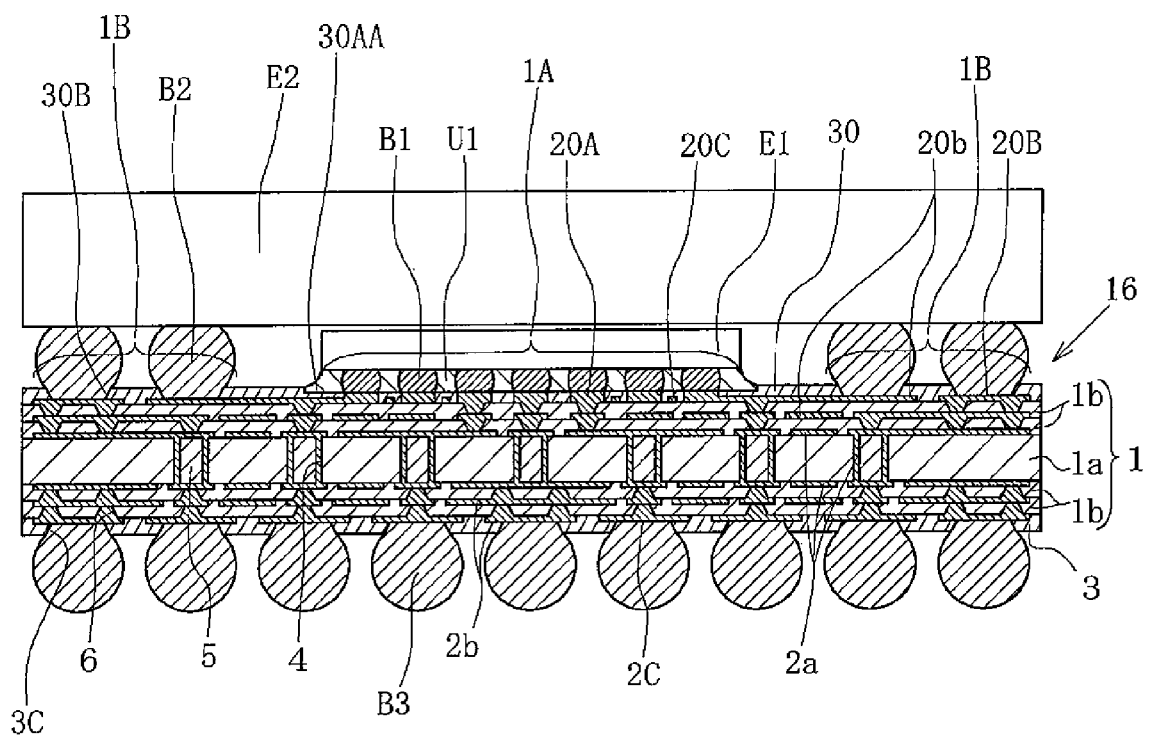
FIG. 28 is a schematic sectional view showing other example in the wiring board according to the second preferred embodiment of the invention.
Figure 29:
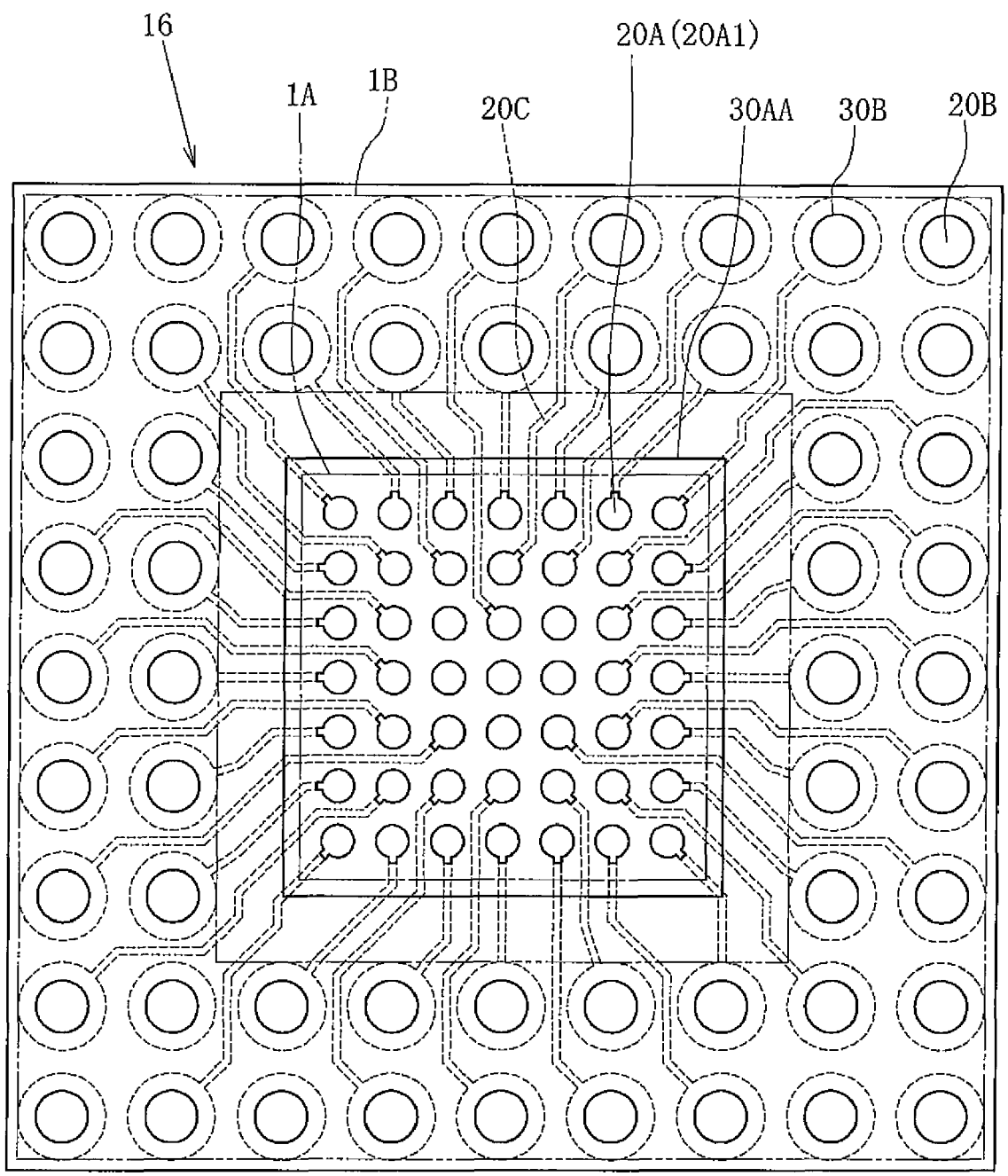
FIG. 29 is a plan view showing the wiring board in FIG. 28.
Figure 30:
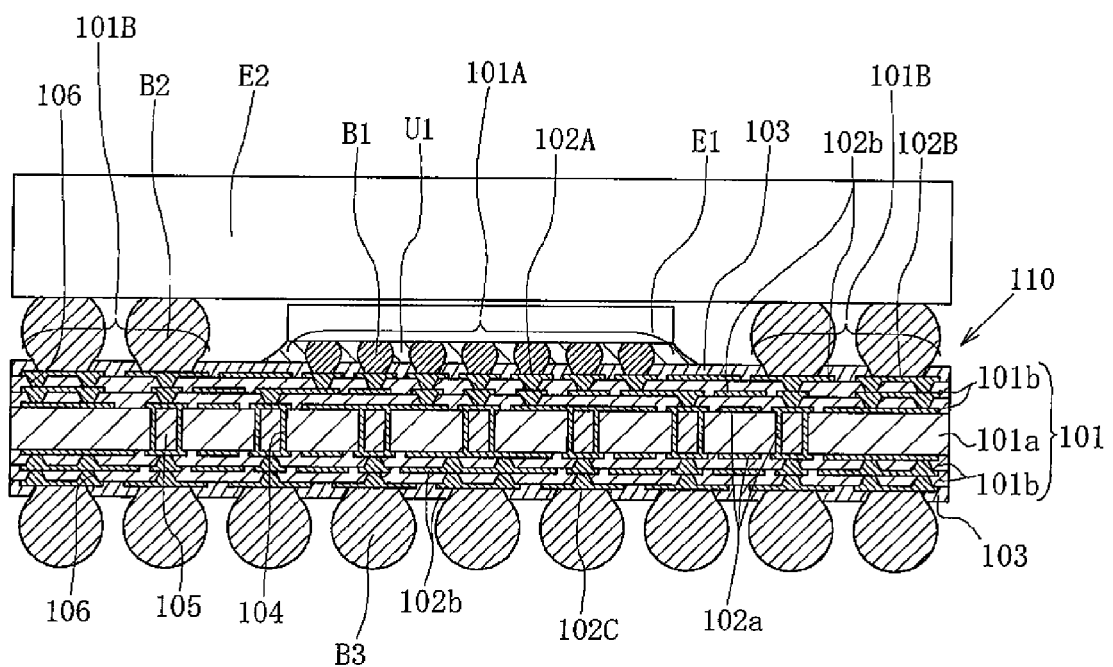
FIG. 30 is a schematic sectional view showing a conventional wiring board.
Figure 31:
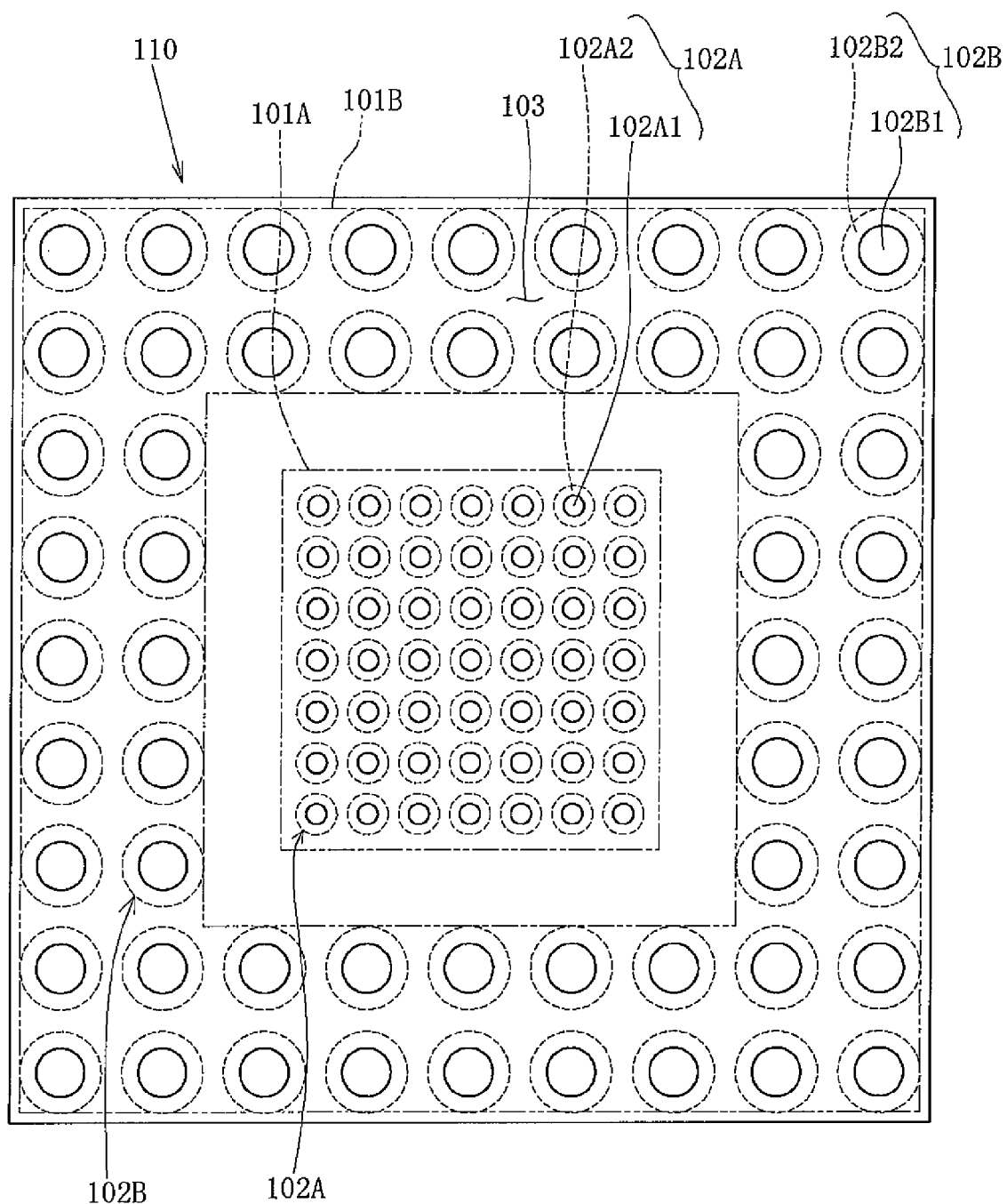
FIG. 31 is a plan view showing the wiring board in FIG. 30.

Alternatively, the structure of the wiring board 15 may be changed into, for example, the structure of a wiring board 16 shown in FIGS. 28 and 29. That is, the foregoing preferred embodiment has illustrated the arrangement of the concave parts 30A for individually exposing the semiconductor element connection pads 20A. As shown in FIGS. 28 and 29, by disposing concave parts 30AA for collectively surrounding the semiconductor element mounting portion 1A in the solder resist layer 30 on the upper surface side, the entire upper surfaces 20A1 of the semiconductor element connection pads 20A may be exposed onto the bottom surfaces of these concave parts 30AA.

In the above case, when the filling resin U1 is filled into the space between the semiconductor integrated circuit element E1 and the wiring board 16, the side walls of these concave parts 30AA function as dams for preventing overflow of the filling resin U1, thereby avoiding the unnecessary overflow of the filling resin U1 onto the outer peripheral part of the insulation substrate 1. Otherwise, the structure is identical to that of the wiring board 15 described above.

While the several preferred embodiments of the invention have been described and illustrated above, it is to be understood that the invention is not limited to these preferred embodiments, and various improvements and changes can be made therein within the scope of the invention as claimed. For example, in the foregoing preferred embodiments, nickel plating and gold plating may be deposited sequentially by electroless plating method or electrolytic plating method, or a solder layer containing tin, indium, or the like may be deposited onto the upper surfaces of the semiconductor element connection pads and the upper surface mid parts of the electronic component connection pads which are exposed from the solder resist layer, in order to prevent the semiconductor element connection pads and the electronic component connection pads from being subjected to oxidation corrosion, and also achieve satisfactory connection with the conductive bumps or the solder balls.

What is claimed is:

1. A wiring board comprising:
    an insulation substrate having on its upper surface a mounting portion for mounting a semiconductor element;
    a plurality of circular semiconductor element connection pads comprising a plating layer which are deposited in a lattice form on the mounting portion of the insulation substrate, electrodes of the semiconductor element being connected to upper surfaces of the semiconductor element connection pads through conductive bumps; and
    a solder resist layer deposited onto the insulation substrate, the solder resist layer covering side surfaces of the semiconductor element connection pads and exposing the upper surfaces of the semiconductor element connection pads,
    the solder resist layer having a concave part whose bottom surface corresponds to at least all the upper surfaces of the semiconductor element connection pads, and
    an electronic component connection pad comprising a plating layer, to which an electronic component other than the semiconductor element is connected, is formed outside of the mounting portion on the upper surface of the insulation substrate, and an upper surface mid part of the electronic component connection pad is exposed from the solder resist layer,
    wherein a thickness of the semiconductor element connection pad is larger than a thickness of the electronic component connection pad.

2. The wiring board according to claim 1, wherein the concave part is formed so that the bottom surface corresponds to at least all area corresponding to the mounting portion, and a side wall thereof surrounds the mounting portion.

3. The wiring board according to claim 1, wherein the concave part is formed separately for each of the semiconductor element connection pads.

* * * * *